US010761251B2

(12) United States Patent
Tomeba et al.

(10) Patent No.: US 10,761,251 B2
(45) Date of Patent: Sep. 1, 2020

(54) RESIN FILM, COLORING PHOTOSENSITIVE COMPOSITION, RESIN FILM PRODUCTION METHOD, COLOR FILTER, LIGHT SHIELDING FILM, SOLID-STATE IMAGING ELEMENT, AND IMAGE DISPLAY DEVICE

(71) Applicant: FUJIFILM Corporation, Tokyo (JP)

(72) Inventors: Hisamitsu Tomeba, Haibara-gun (JP); Makoto Kubota, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 261 days.

(21) Appl. No.: 15/915,327

(22) Filed: Mar. 8, 2018

(65) Prior Publication Data

US 2018/0196178 A1 Jul. 12, 2018

Related U.S. Application Data

(63) Continuation of application No. PCT/JP2016/078060, filed on Sep. 23, 2016.

(30) Foreign Application Priority Data

Sep. 30, 2015 (JP) .................................. 2015-194833

(51) Int. Cl.
*G03F 7/039* (2006.01)
*H01L 27/14* (2006.01)
*G02B 5/20* (2006.01)
*G02B 5/22* (2006.01)
*C08F 220/28* (2006.01)
*G03F 7/00* (2006.01)
*G03F 7/105* (2006.01)
*C08F 212/14* (2006.01)
*C08F 220/18* (2006.01)
*G03F 7/20* (2006.01)

(52) U.S. Cl.
CPC ............ *G02B 5/223* (2013.01); *C08F 212/14* (2013.01); *C08F 220/18* (2013.01); *C08F 220/28* (2013.01); *G03F 7/0007* (2013.01); *G03F 7/039* (2013.01); *G03F 7/0395* (2013.01); *G03F 7/0397* (2013.01); *G03F 7/105* (2013.01); *G03F 7/20* (2013.01); *C08F 220/1806* (2020.02); *C08F 220/1807* (2020.02)

(58) Field of Classification Search
CPC ...... G03F 7/0007; G03F 7/039; G03F 7/0397; G03F 7/20; G03F 7/105; G02B 5/20; G02B 5/201; G02B 5/223; G02F 1/133512; G02F 1/133514; G02F 1/133516; H01L 27/14621
USPC .................................................. 430/7, 270.1
See application file for complete search history.

(56) References Cited

U.S. PATENT DOCUMENTS

| 6,171,733 B1* | 1/2001 | Dan ................... G02F 1/133512 |
| | | 430/270.1 |
| 2015/0253663 A1* | 9/2015 | Komatsu ............... G03F 7/0397 |
| | | 430/285.1 |
| 2016/0320529 A1 | 11/2016 | Kashiwagi et al. |
| 2016/0327865 A1 | 11/2016 | Kashiwagi et al. |

FOREIGN PATENT DOCUMENTS

| EP | 2447774 A1 | 5/2012 |
| JP | 2004-029169 A | * 1/2004 |
| JP | 2009-87908 A | 4/2009 |
| JP | 2009-276772 A | 11/2009 |
| JP | 2010-20033 A | 1/2010 |
| JP | 2012-169556 A | 9/2012 |
| JP | 2013-83844 A | 5/2013 |
| JP | 2013-083937 A | 5/2013 |
| TW | 201307997 A1 | 2/2013 |
| TW | 201443558 A | 11/2014 |
| WO | 2011034007 A1 | 3/2011 |
| WO | 2013008700 A1 | 1/2013 |
| WO | 2015/125870 A1 | 8/2015 |
| WO | 2015/125871 A1 | 8/2015 |

OTHER PUBLICATIONS

Computer-generated translation of JP 2004-029169 (dated Jan. 2004). (Year: 2004).*
Communication dated Apr. 3, 2019 by the Korean Patent Office in application No. 10-2018-7007565.
Communication dated Dec. 24, 2019 from Japanese Patent Office in counterpart JP Application No. 2017-543214.
Communication dated Mar. 19, 2019 issued by the Japanese Patent Office in counterpart application No. 2017-543214.
Communication dated Feb. 20, 2020 from the Taiwanese Patent Office in application No. 105131178.
International Search Report dated Dec. 20, 2016 issued by the International Searching Authority in application No. PCT/JP2016/078060.
International Preliminary Report on Patentability with the translation of Written Opinion dated Apr. 3, 2018 issued by the International Bureau in application No. PCT/JP2016/078060.

* cited by examiner

*Primary Examiner* — John A McPherson
(74) *Attorney, Agent, or Firm* — Sughrue Mion, PLLC

(57) ABSTRACT

Provided are a resin film which exhibits an excellent low reflectivity, a coloring photosensitive composition capable of forming a resin film which exhibits an excellent low reflectivity, a resin film production method, a color filter, a light shielding film, a solid-state imaging element, and an image display device. The resin film of the present invention includes at least two or more resins, a coloring agent, and a photoacid generator, in which the resin film has a peak at which the value of A1/A2 is greater than 0.1 and 2.5 or less in a light scattering measurement of the resin film, in the case where a half-width of the peak is A1 and a scattering angle of a maximum light intensity of the peak is A2 in a spectrum in which a scattering angle is plotted on the horizontal axis and a scattered light intensity is plotted on the vertical axis.

8 Claims, No Drawings

RESIN FILM, COLORING PHOTOSENSITIVE COMPOSITION, RESIN FILM PRODUCTION METHOD, COLOR FILTER, LIGHT SHIELDING FILM, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2016/078060 filed on Sep. 23, 2016, which claims priority under 35 U.S.C. § 119(a) to Japanese Patent Application No. 2015-194833 filed on Sep. 30, 2015. The above application is hereby expressly incorporated by reference, in its entirety, into the present application.

BACKGROUND OF THE INVENTION

1. Field of the Invention

The present invention relates to a resin film, a coloring photosensitive composition, a resin film production method, a color filter, a light shielding film, a solid-state imaging element, and an image display device.

2. Description of the Related Art

A resin film containing a coloring agent (particularly, a pigment) is applied to various uses. For example, a resin film containing a black pigment as a pigment is applied as a light shielding film to various uses (for example, a light shielding film disposed in a solid-state imaging element).

In JP2012-169556A, the occurrence of noise is suppressed by providing a predetermined light shielding film in a solid-state imaging device. As a composition for forming a light shielding film, a light shielding composition containing a black pigment such as titanium black is used.

SUMMARY OF THE INVENTION

On the other hand, various requirements have recently been demanded for a resin film. In particular, there is a strong demand for reduction of reflection. For example, along with the miniaturization, thinning, and high sensitivity of a solid-state imaging device, a resin film used as a light shielding film is required to achieve a further reduction of reflection from the viewpoint of suppression of noise due to stray light.

The present inventors have produced a light shielding film using the black radiation-sensitive composition specifically disclosed in JP2012-169556A. As a result of studies on the reflection characteristics of the resulting film, it was found that a further improvement is required.

In view of the above circumstances, it is an object of the present invention to provide a resin film which exhibits an excellent low reflectivity.

Further, it is another object of the present invention to provide a coloring photosensitive composition capable of forming a resin film which exhibits an excellent low reflectivity (in particular, low reflectivity against light having a wavelength in the visible region), a resin film production method, a color filter, a light shielding film, a solid-state imaging element, and an image display device.

As a result of extensive studies to achieve the foregoing objects, the present inventors have found that a resin film having a predetermined structure is capable of achieving the foregoing objects. The present invention has been completed based on these findings.

That is, the present inventors have found that the foregoing objects can be achieved by the following constitution.

(1) A resin film, comprising:
at least two or more resins;
a coloring agent; and
a photoacid generator,
in which the resin film has a peak at which the value of A1/A2 is greater than 0.1 and 2.5 or less in a light scattering measurement of the resin film, in the case where a half-width of the peak is A1 and a scattering angle of a maximum light intensity of the peak is A2 in a spectrum in which a scattering angle is plotted on the horizontal axis and a scattered light intensity is plotted on the vertical axis.

(2) The resin film according to (1), in which a surface roughness Ra is 100 to 2000 Å.

(3) The resin film according to (1) or (2), in which the resin film has a phase separation structure in which the structural period shows 0.1 to 2 µm.

(4) A coloring photosensitive composition, comprising:
a first resin containing a structural unit having a cyclic ether group;
a second resin containing a structural unit having a saturated hydrocarbon group having 4 or more carbon atoms and not containing a structural unit having a cyclic ether group;
a coloring agent; and
a photoacid generator, and
in which at least one of the following requirements 1 or 2 is satisfied.

Requirement 1: The first resin is a resin whose solubility in an alkaline developer is improved by the action of an acid.

Requirement 2: The coloring photosensitive composition further comprises a third resin whose solubility in an alkaline developer is improved by the action of an acid.

(5) The coloring photosensitive composition according to (4), in which the first resin contains a structural unit represented by General Formula (X2) or a structural unit represented by General Formula (X3).

(6) The coloring photosensitive composition according to (4) or (5), in which the second resin contains a structural unit represented by any one of General Formulae (1) to (4).

(7) The coloring photosensitive composition according to any one of (4) to (6), in which the coloring agent is a black pigment.

(8) The coloring photosensitive composition according to any one of (4) to (7), in which the mass ratio of the mass of the first resin to the mass of the second resin is 0.2 to 5, provided that the mass ratio is the mass of first resin/the mass of second resin.

(9) A resin film production method, comprising:
a colored layer forming step of applying the coloring photosensitive composition according to any one of (4) to (8) onto a support to form a colored layer;
an exposure step of exposing the colored layer patternwise through a mask; and
a development step of developing the colored layer after exposure to form a patterned resin film.

(10) A color filter, comprising:
the resin film according to any one of (1) to (3), or a resin film obtained by curing the coloring photosensitive composition according to any one of (4) to (8).

(11) A light shielding film, comprising:
the resin film according to any one of (1) to (3), or a resin film obtained by curing the coloring photosensitive composition according to any one of (4) to (8).

(12) A solid-state imaging element, comprising:
the resin film according to any one of (1) to (3), or a resin film obtained by curing the coloring photosensitive composition according to any one of (4) to (8).

(13) An image display device, comprising:
the resin film according to any one of (1) to (3), or a resin film obtained by curing the coloring photosensitive composition according to any one of (4) to (8).

According to the present invention, it is possible to provide a resin film which exhibits an excellent low reflectivity.

Further, according to the present invention, it is possible to provide a coloring photosensitive composition capable of forming a resin film which exhibits an excellent low reflectivity, a resin film production method, a color filter, a light shielding film, a solid-state imaging element, and an image display device.

DESCRIPTION OF THE PREFERRED EMBODIMENTS

Hereinafter, aspects for carrying out the present invention will be described.

In the present specification, in the case where a group (atomic group) is denoted without specifying whether it is substituted or unsubstituted, it includes a group having a substituent and a group having no substituent. For example, the term "alkyl group" includes not only an alkyl group having no substituent (unsubstituted alkyl group) but also an alkyl group having a substituent (substituted alkyl group). In the present specification, the term "(meth)acrylate" refers to an acrylate and methacrylate, the term "(meth)acrylic" refers to acrylic and methacrylic, and the term "(meth)acryloyl" refers to acryloyl and methacryloyl.

The term "pigment" refers to, for example, an insoluble colorant compound which is not soluble in a solvent. Here, the solvent includes the solvents exemplified in the section of <Solvent> which will be described later. Therefore, a colorant compound not soluble in these solvents corresponds to the pigment in the present invention.

The term "actinic rays" or "radiation" as used herein refers to, for example, a bright line spectrum of mercury lamp, far ultraviolet rays represented by excimer laser, extreme ultraviolet rays (EUV light), X-rays, or electron beams. The term "light" as used herein refers to actinic rays or radiation. Unless otherwise indicated, the term "exposure" as used herein includes not only exposure to a mercury lamp, far ultraviolet rays represented by excimer laser, X-rays, EUV light, or the like but also lithography with particle beams such as electron beams or ion beams. The numerical range shown with "to" as used herein refers to a range including the numerical values indicated before and after "to" as a lower limit value and an upper limit value, respectively. The term "structural unit" as used herein has the same meaning as "repeating unit".

As used herein, "1 Å" corresponds to "0.1 nanometers (nm)".

One of the features of the present invention is that a peak is observed in the light scattering measurement of the resin film. As will be described later in detail, in such a resin film, a phase separation structure is formed of two or more resins and accordingly, low reflection is realized.

In particular, the characteristics of the resin film become excellent by using two specific resins.

Hereinafter, the resin film of the present invention will be described first in detail, and then the suitable aspects of the coloring photosensitive composition will be described in detail.

<Resin Film>

The resin film is a film including at least two or more resins, a coloring agent, and a photoacid generator, in which the resin film has a peak at which the value of A1/A2 is greater than 0.1 and 1 or less in a light scattering measurement, in the case where a half-width of the peak is A1 and a scattering angle of a maximum light intensity of the peak is A2 in a spectrum in which a scattering angle is plotted on the horizontal axis and a scattered light intensity is plotted on the vertical axis.

In the resin film of the present invention, it is considered that two or more resins undergo phase separation so that a phase separation structure is formed, and as a result, low reflection characteristics are improved. More specifically, the formation of the phase separation structure results in the formation of fine unevenness on the surface of the resin film, which consequently contributes to an improvement of the low reflection characteristics. The fact that a predetermined peak is observed by the light scattering measurement means that there is a phase separation structure in the resin film. That is, in the case where the phase separation structure is included in the resin film, the scattering maximum appears in the scattering measurement carried out using a light scattering apparatus. The presence of the scattering maximum in this light scattering measurement is proof that the resin film has a regular phase separation structure with a certain period. It should be noted that the period $\Lambda m$ corresponds to the structural period, and the value can be calculated by Expression (I) $\Lambda m = (\lambda/2)/\sin(\theta m/2)$ using the wavelength $\lambda$ in the scatterer of the scattered light and the scattering angle $\theta m$ giving the scattering maximum.

In addition to the size of the structural period, information on the distribution of the structural period is obtained in the light scattering measurement. Specifically, the peak position of the scattering maximum in the spectrum obtained by those measurements, that is, the scattering angle $\theta m$ corresponds to the size of the structural period in the phase separation structure, and the spreading of the peak corresponds to the uniformity of the structure. In the light scattering measurement of the resin film, the present inventors paid attention to the scattering maximum peak half-width of the spectrum obtained by plotting the scattered light intensity against the angle of the scattered light (scattering angle). More specifically, the present inventors have found that low reflection can be realized in the case where the value related to the structure uniformity represented by A1/A2 is within a predetermined range, assuming that the half-width of the peak is A1 and the scattering angle of the maximum light intensity of the peak is A2 in the spectrum where the scattering angle is plotted on the horizontal axis and the scattered light intensity is plotted on the vertical axis. That is, the present inventors have found that low reflection is achieved in the case where a predetermined phase separation structure included in the resin layer having a peak showing such A1/A2 is provided.

The value of A1/A2 is 2.5 or less, and from the viewpoint that the resin film exhibits lower reflectivity (hereinafter, simply referred to as "the effects of the present invention are excellent"), it is preferably 2.0 or less, more preferably 1.0 or less, still more preferably 0.9 or less, and particularly preferably 0.8 or less. The lower limit of the value of A1/A2 is greater than 0.1.

In the resin film of the present invention, a plurality of peaks may be observed in the light scattering measurement, depending on the type of polymer used. In the case where a plurality of peaks are present as described above, it is sufficient that the value of A1/A2 falls within the above-specified range (greater than 0.1 and 2.5 or less) in at least one of the peaks.

The half-width of the peak in the present invention is the width of the peak at the midpoint (point C) of the line segment connecting (point A) and (point B) in the case where a straight line parallel to the graph vertical axis is drawn from the apex (point A) of the peak and the point of intersection (point B) between this straight line and the base line of the spectrum is taken. It is to be noted that the width of the peak referred to here is the width on a straight line parallel to the base line and passing through (point C).

Further, the scattering angle of the maximum light intensity of the peak is intended as a scattering angle indicating the maximum light intensity (apex) in the peak.

Note that fine jumping like noise or the like is not counted as a peak, and a peak position may be determined by carrying out a fitting method such as an appropriate normal distribution approximation, if necessary.

As a method of measuring A1/A2, there is a method in which a resin film having a thickness of 0.5 μm is prepared, measurement was carried out using a light scattering apparatus ("DYNA 3000" manufactured by Otsuka Electronics Co., Ltd.), a spectrum with a scattering angle being plotted on the horizontal axis and a scattered light intensity being plotted on the vertical axis is obtained, and then the half-width and the scattering angle of the peak defined above are determined to obtain A1/A2.

The structural period determined by the light scattering measurement of the resin film is not particularly limited, but is preferably 0.1 to 10 μm and more preferably 0.1 to 2.0 μm from the viewpoint that the effects of the present invention are excellent.

In the method of measuring the structural period, the above-mentioned light scattering measurement is carried out to calculate the structural period from the above-mentioned $$(\Lambda m=(\lambda/2)/\sin(\theta m/2)).\qquad\text{Expression (I)}$$

The surface roughness of the resin film is not particularly limited, but the surface roughness Ra is preferably 20 to 3000 Å (angstrom), more preferably 100 to 2000 Å, and still more preferably 200 to 800 Å, from the viewpoint that the effects of the present invention are excellent.

The surface roughness Ra was calculated by measuring the distance of 1 mm of the resin film at a resolution of 1 μm/point using DektakXT (manufactured by Bruker Corporation).

The thickness of the resin film is not particularly limited, but is preferably 0.2 to 10 μm and more preferably 0.5 to 3 μm, from the viewpoint that the effects of the present invention are excellent.

Materials constituting the resin film include at least two or more resins, a coloring agent, and a photoacid generator. These materials will be described later in detail.

The method for producing a resin film having the above-mentioned characteristics (for example, a patterned resin film) is not particularly limited, but a method using a coloring photosensitive composition containing predetermined materials can be mentioned. More specifically, preferred is an aspect including a colored layer forming step of applying a coloring photosensitive composition containing predetermined materials onto a support to form a colored layer, an exposure step of exposing the colored layer patternwise through a predetermined mask, and a development step of developing the colored layer after exposure to form a resin film.

In particular, according to such a method, a phase separation structure is formed in the colored layer, and in the subsequent development step, one of the resins is preferentially removed due to a difference in developer solubility of the resin contained in the colored layer in the unexposed region, and as a result, a resin film in which fine unevenness more remarkably appears on the surface is formed and the low reflectivity is further improved. The development treatment may be either solvent development or alkaline development, but alkaline development is preferred.

These methods will be described in more detail in the description of the coloring photosensitive composition below.

<Coloring Photosensitive Composition>

The coloring photosensitive composition (hereinafter, also simply referred to as a "composition") contains at least two resins, a coloring agent, and a photoacid generator.

Hereinafter, individual components will be described in detail.

<Resin>

The coloring photosensitive composition (resin film) contains at least two resins. There is no particular limitation on the type of the resin as long as a resin film exhibiting the above-mentioned predetermined characteristics is obtained. Although the mechanism of formation of the resin film is not clear, it is presumed that a hydrophilic portion (represented by a cyclic ether group) and a hydrophobic portion (represented by an alkylene group) are mixed in the film, and for example, a sea-island structure is formed such that a portion around the island structure whose core is a hydrophobic portion is surrounded by a hydrophilic portion.

In particular, from the viewpoint that the effects of the present invention are excellent, the coloring photosensitive composition preferably contains the following first resin and second resin. In the case where the resin film has a phase separation structure formed using these two resins, the reflectivity thereof is further reduced.

(First Resin)

The first resin is a resin for forming a phase separation structure, and here, in particular, a resin containing a structural unit having a cyclic ether group. The cyclic ether group refers to an ether group having a structure in which the carbon of the cyclic hydrocarbon is substituted by oxygen. For example, the cyclic ether group refers to a cyclic ether group having a 3- to 6-membered ring structure. Examples of the cyclic ether group include an epoxy group (also referred to as an epoxy ring), an oxetane group (also referred to as an oxetane ring), a tetrahydrofuran group, a tetrahydropyran group, a dioxolane group, and a trioxane group, among which an epoxy group or an oxetane group is preferable.

In the present specification, the epoxy group includes an oxirane ring which is a 3-membered ring ether, and includes an epoxycyclohexane ring or the like in addition to an epoxy group in a narrow sense.

The cyclic ether group is preferably a 4- to 6-membered ring structure and more preferably a 5-membered ring structure, from the viewpoint that the effects of the present invention are excellent.

From the viewpoint that the effects of the present invention are excellent, the cyclic ether group is preferably arranged in the side chain in the first resin.

A suitable aspect of the structural unit having a cyclic ether group may be, for example, a structural unit represented by General Formula (X1).

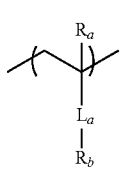

General Formula (XI)

In General Formula (X1), $R_a$ represents a hydrogen atom or an alkyl group. The number of carbon atoms in the alkyl group is not particularly limited, but it is preferably 1 to 3.

$L_a$ represents a single bond or a divalent linking group. Examples of the divalent linking group include an alkylene group which may be substituted by a halogen atom, an arylene group which may be substituted by a halogen atom, —$NR^{12}$—, —$CONR^{12}$—, —CO—, —$CO_2$—, $SO_2NR^{12}$—, —O—, —S—, —$SO_2$—, and a combination thereof. $R^{12}$ represents a hydrogen atom or a methyl group. Among them, $L_a$ may be, for example, —CO—, —O—, an alkylene group, or a group formed by combination thereof (for example, —COO—, an oxyalkylene group, or a polyoxyalkylene group).

$R_b$ represents a cyclic ether group. The definition of the cyclic ether group is as described above.

The most suitable aspect of the structural unit having a cyclic ether group may be, for example, a structural unit represented by General Formula (X2) and a structural unit represented by General Formula (X3). Incidentally, the resin containing the structural unit represented by General Formula (X2) also corresponds to a resin whose solubility in an alkaline developer is improved by the action of an acid.

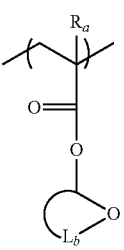

General Formula (X2)

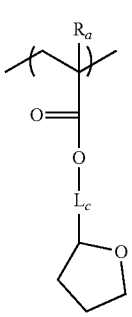

General Formula (X3)

In General Formula (X2), the definition of $R_a$ is as described above.

$L_b$ represents an alkylene group. The number of carbon atoms in the alkylene group is not particularly limited, but it is preferably 1 to 10, more preferably 1 to 6, still more preferably 2 to 5, particularly preferably 3 to 4, and most preferably 3.

In General Formula (X3), the definition of $R_a$ is as described above.

$L_c$ may be, for example, a single bond, an alkylene group, an oxyalkylene group, a poly(oxyalkylene) group, an ester group, or a group formed by combination thereof. Among them, an alkylene group is preferable.

The content of the structural unit having a cyclic ether group in the first resin is not particularly limited, but it is preferably 3 to 95 mol % and more preferably 10 to 80 mol % with respect to the total structural units, from the viewpoint that the effects of the present invention are excellent.

The first resin may contain a structural unit other than the above-mentioned structural unit having a cyclic ether group.

For example, a hydrophobic structural unit, a structural unit having an acid group, a structural unit having a basic group, a structural unit having a coordinating group, or a structural unit having reactivity, each of which may be contained in a second resin to be described later, may be contained in the first resin.

Details of these structural units will be described later in detail. The structural unit having an acid group is a structural unit having an acid group such as a carboxylic acid group, a sulfonic acid group, a phosphoric acid group, or a phenolic hydroxyl group, as will be described later.

In addition, the first resin may contain a structural unit having a group capable of decomposing by the action of an acid to generate a polar group, which is contained in a third resin to be described later.

In the case where the first resin contains a hydrophobic structural unit, the content of the hydrophobic structural unit is not particularly limited, but it is preferably 2 to 95 mol % and more preferably 5 to 80 mol % with respect to the total structural units, from the viewpoint that the effects of the present invention are excellent.

In the case where the first resin contains a structural unit having an acid group, the content of the structural unit having an acid group is not particularly limited, but it is preferably 2 to 80 mol % and more preferably 5 to 40 mol %, with respect to the total structural units, from the viewpoint that the effects of the present invention are excellent.

From the viewpoint that the effects of the present invention are excellent, the weight-average molecular weight of the first resin is preferably 4,000 to 300,000, more preferably 5,000 to 200,000, still more preferably 6,000 to 100,000, and particularly preferably 10,000 to 50,000, in terms of polystyrene as measured by the GPC (Gel Permeation Chromatography) method.

The GPC method uses HLC-8020GPC (manufactured by Tosoh Corporation) and is based on a method using TSKgel SuperHZM-H, TSKgel SuperHZ4000, or TSKgel SuperHZ2000 (manufactured by Tosoh Corporation, 4.6 mm ID×15 cm) as a column and tetrahydrofuran (THF) as an eluent.

The synthesis method of the first resin is not particularly limited, and the first resin can be synthesized by combining known synthesis methods.

In addition, the first resin may be a resin whose solubility in an alkaline developer is improved by the action of an acid. For example, in the case where the structural unit represented by General Formula (X2) is contained in the first resin, or in the case where a structural unit having a group capable of decomposing by the action of an acid to generate a polar group is contained in the first resin, the first resin corresponds to a resin whose solubility in an alkaline developer is improved by the action of an acid.

The content of the first resin in the composition is not particularly limited, but it is preferably 2 to 40 mass % and more preferably 4 to 30 mass % with respect to the total solid content of the composition, from the viewpoint that the effects of the present invention are excellent.

(Second Resin)

The second resin is a resin containing a structural unit having a saturated hydrocarbon group having 4 or more carbon atoms and not containing a structural unit having a cyclic ether group. It is considered that the second resin partially forms an aggregate in the resin film by the action of the saturated hydrocarbon group. The definition of the structural unit having a cyclic ether group is as described for the first resin.

The number of carbon atoms in the saturated hydrocarbon group is 4 or more, and it is preferably 4 to 20 and more preferably 4 to 8 from the viewpoint that the effects of the present invention are excellent. The saturated hydrocarbon group may be linear, branched, or cyclic.

The second resin is preferably a resin containing a structural unit having a linear alkylene group having 4 or more carbon atoms.

The linear alkylene group is a straight-chain alkylene group. The number of carbon atoms contained in the alkylene group is 4 or more, and it is preferably 4 to 20 and more preferably 4 to 8 from the viewpoint that the effects of the present invention are excellent.

As a suitable aspect of the structural unit having a linear alkylene group having 4 or more carbon atoms, a structural unit represented by any one of General Formulae (1) to (4) can be mentioned in that the effects of the present invention are excellent.

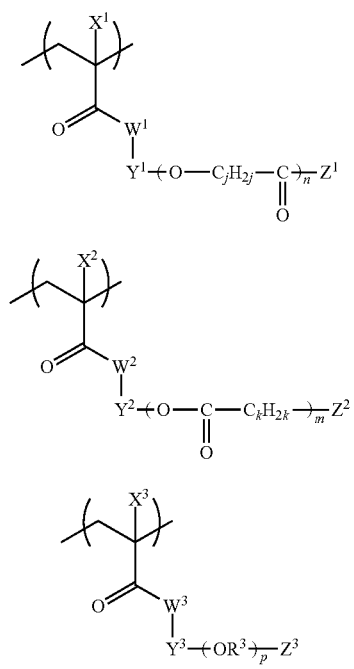

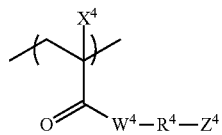

In General Formulae (1) to (4), $W^1$, $W^2$, $W^3$, and $W^4$ each independently represent an oxygen atom or NH. $W^1$, $W^2$, $W^3$, and $W^4$ are preferably oxygen atoms.

In General Formulae (1) to (4), $X^1$, $X^2$, $X^3$, and $X^4$ each independently represent a hydrogen atom or a monovalent organic group. From the viewpoint of synthesis constraints, it is preferred that $X^1$, $X^2$, $X^3$, and $X^4$ are each independently a hydrogen atom or an alkyl group having 1 to 12 carbon atoms, it is more preferred that $X^1$, $X^2$, $X^3$, and $X^4$ are each independently a hydrogen atom or a methyl group, and it is still more preferred that $X^1$, $X^2$, $X^3$, and $X^4$ are each independently a methyl group.

In General Formulae (1) to (3), $Y^1$, $Y^2$, and $Y^3$ each independently represent a divalent linking group, and the type of the linking group is not particularly limited. Specific examples of the divalent linking group represented by $Y^1$, $Y^2$, and $Y^3$ include the following linking groups (Y-1) to (Y-21). In the linking groups shown below, A and B respectively mean a binding site to the left terminal group and the right terminal group in General Formulae (1) to (3). Among the linking groups shown below, a linking group of (Y-2) or (Y-13) is preferred from the viewpoint of ease of synthesis.

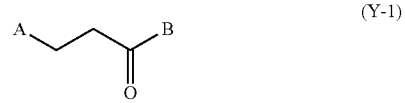

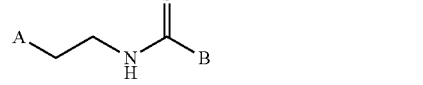

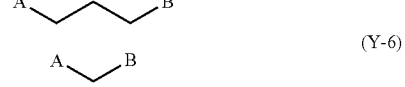

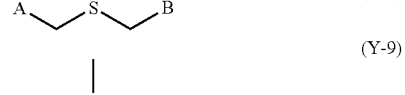

(Y-11) 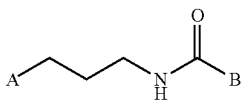

(Y-12) 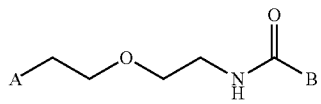

(Y-13) 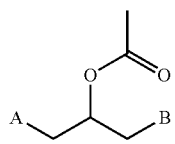

(Y-14) 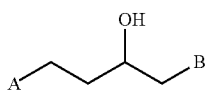

(Y-15) 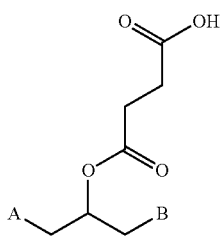

(Y-16) 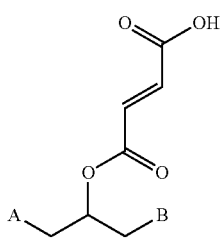

(Y-17) 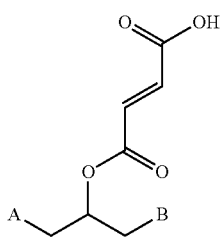

(Y-18) 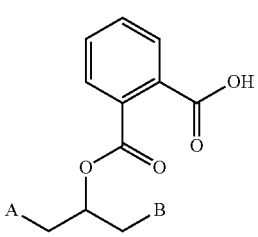

(Y-19) 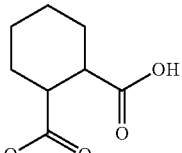

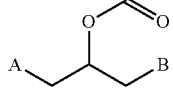

(Y-20) 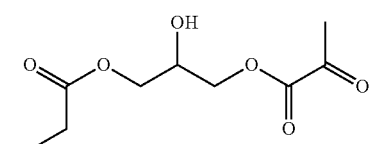

(Y-21) 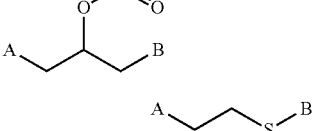

In General Formulae (1) to (3), $Z^1$, $Z^2$, and $Z^3$ each independently represent a monovalent organic group. In General Formula (4), $Z^4$ represents a hydrogen atom or a monovalent organic group.

The type of the organic group is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among them, the organic group represented by $Z^1$, $Z^2$, $Z^3$, and $Z^4$ is preferably an organic group having a steric repulsion effect from the viewpoint of improving the dispersibility of a coloring agent, and $Z^1$, $Z^2$, $Z^3$, and $Z^4$ are each independently preferably an alkyl group or alkoxy group having 5 to 24 carbon atoms and are each independently more preferably a branched alkyl group having 5 to 24 carbon atoms, a cyclic alkyl group having 5 to 24 carbon atoms, or an alkoxy group having 5 to 24 carbon atoms. The alkyl group contained in the alkoxy group may be linear, branched, or cyclic.

In General Formulae (1) to (3), n, m, and p are each independently an integer of 1 to 500.

In General Formulae (1) and (2), j and k each independently represent an integer of 4 to 8. In General Formulae (1) and (2), j and k are preferably an integer of 4 to 6 and more preferably 5 from the viewpoint of dispersion stability of a coloring agent and developability.

In General Formula (3), $R^3$ represents a linear alkylene group having 4 or more carbon atoms and preferably a linear alkylene group having 4 to 10 carbon atoms. In the case where p is 2 to 500, a plurality of $R^3$'s may be the same as or different from each other.

In General Formula (4), $R^4$ represents a linear alkylene group having 4 or more carbon atoms, preferably a linear alkylene group having 4 to 20 carbon atoms, and more preferably a linear alkylene group having 4 to 10 carbon atoms.

Further, the second resin may contain two or more structural units having different structures. That is, the molecule of the second resin may contain structural units represented by General Formulae (1) to (4) having different structures from each other, and in the case where n, m, and p in General Formulae (1) to (3) each represent an integer of 2 or more, in General Formulae (1) and (2), structures in which j and k are different from each other may be contained in the side chain, and in General Formula (3), a plurality of $R^3$'s present in the molecule may be the same as or different from each other.

As the structural unit represented by General Formula (1), a structural unit represented by General Formula (1A) is more preferable in that the effects of the present invention are excellent.

As the structural unit represented by General Formula (2), a structural unit represented by General Formula (2A) is more preferable in that the effects of the present invention are excellent.

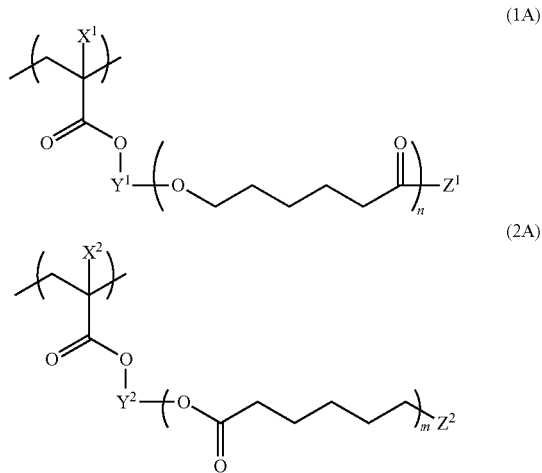

In General Formula (1A), $X^1$, $Y^1$, $Z^1$, and n have the same definition as $X^1$, $Y^1$, $Z^1$, and n in General Formula (1), and the same will also apply to the preferred ranges thereof. In General Formula (2A), $X^2$, $Y^2$, $Z^2$, and m have the same definition as $X^2$, $Y^2$, $Z^2$, and m in General Formula (2), and the same will also apply to the preferred ranges thereof.

As the structural unit represented by General Formula (3), a structural unit represented by General Formula (3A) or (3B) is more preferable in that the effects of the present invention are excellent.

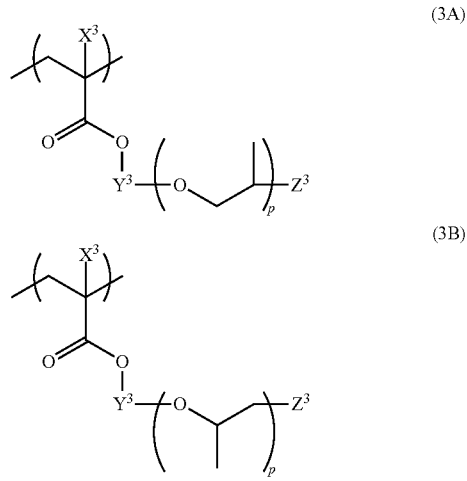

In General Formula (3A) or (3B), $X^3$, $Y^3$, $Z^3$, and p have the same definition as $X^3$, $Y^3$, $Z^3$, and p in General Formula (3), and the same will also apply to the preferred ranges thereof.

More preferably, the second resin contains a structural unit represented by General Formula (1A).

The content of the structural unit having a linear alkylene group having 4 or more carbon atoms (for example, the structural unit represented by General Formulae (1) to (4)) in the second resin is not particularly limited, but it is preferably 2 to 90 mol % and more preferably 4 to 50 mol % with respect to the total structural units, from the viewpoint that the effects of the present invention are excellent.

Further, the second resin preferably contains a hydrophobic structural unit different from a structural unit having a linear alkylene group having 4 or more carbon atoms. However, in the present invention, the hydrophobic structural unit is a structural unit not having an acid group (for example, a carboxylic acid group, a sulfonic acid group, a phosphoric acid group, or a phenolic hydroxyl group).

The hydrophobic structural unit is preferably a structural unit which is derived from (corresponds to) a compound (monomer) having a ClogP value of 1.2 or more, and more preferably a structural unit which is derived from a compound having a ClogP value of 1.2 to 8.

The ClogP value is a value calculated by the program "CLOGP", which is available from Daylight Chemical Information System, Inc. This program provides values of "calculated logP" calculated using Hansch and Leo's fragment approach (see documents below). The fragment approach is based on the chemical structure of a compound, and divides the chemical structure into partial structures (fragments) and sums the logP contributions assigned to each fragment, whereby the logP value of the compound is estimated. The details thereof are described in the following documents. In the present invention, the ClogP values calculated by the program CLOGP v4.82 are used.

A. J. Leo, Comprehensive Medicinal Chemistry, Vol. 4, C. Hansch, P. G Sammnens, J. B. Taylor and C. A. Ramsden, Eds., p. 295, Pergamon Press, 1990 C. Hansch & A. J. Leo. Substituent Constants for Correlation Analysis in Chemistry and Biology. John Wiley & Sons. A. J. Leo. Calculating logPoct from structure. Chem. Rev., 93, pp 1281-1306, 1993.

The term logP refers to the common logarithm of a partition coefficient P. The logP is a physical property value, being a quantitative numeric value, representing how an organic compound is distributed in an equilibrium of the two-phase system of oil (typically 1-octanol) and water. The logP is expressed in the following expression.

$$\log P = \log(C_{oil}/C_{water})$$

In the expression, Coil represents the molar concentration of the compound in the oil phase, and Cwater represents the molar concentration of the compound in the water phase.

Oil solubility increases as the value of logP crosses zero and increases in the positive direction, and water solubility increases as an absolute value increases in the negative direction. The logP has a negative correlation with the water solubility of the organic compound and is widely used as a parameter for estimating the hydrophilic or hydrophobic properties of an organic compound.

The second resin preferably contains one or more structural units selected from structural units derived from monomers represented by General Formulae (i) to (iii) as a hydrophobic structural unit.

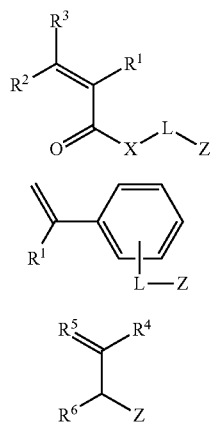

In General Formulae (i) to (iii), $R^1$, $R^2$, and $R^3$ each independently represent a hydrogen atom, a halogen atom (for example, a fluorine atom, a chlorine atom, or a bromine atom), or an alkyl group having 1 to 6 carbon atoms (for example, a methyl group, an ethyl group, or a propyl group).

$R^1$, $R^2$, and $R^3$ are preferably a hydrogen atom or an alkyl group having 1 to 3 carbon atoms, and more preferably a hydrogen atom or a methyl group. It is still more preferred that $R^2$ and $R^3$ are a hydrogen atom.

X represents an oxygen atom (—O—) or an imino group (—NH—), and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), a divalent heterocyclic group, an oxygen atom (—O—), a sulfur atom (—S—), an imino group (—NH—), a substituted imino group (—NR$^{31}$— where R$^{31}$ is an aliphatic group, an aromatic group, or a heterocyclic group), a carbonyl group (—CO—), and a combination thereof.

The divalent aliphatic group may be branched or cyclic. The number of carbon atoms in the aliphatic group is preferably 1 to 20, more preferably 1 to 15, and still more preferably 1 to 10. The aliphatic group may be an unsaturated aliphatic group or a saturated aliphatic group, but it is preferably a saturated aliphatic group. Further, the aliphatic group may have a substituent. Examples of the substituent include a halogen atom, an aromatic group, and a heterocyclic group.

The number of carbon atoms in the divalent aromatic group is preferably 6 to 20, more preferably 6 to 15, and still more preferably 6 to 10. The aromatic group may have a substituent. Examples of the substituent include a halogen atom, an aliphatic group, an aromatic group, and a heterocyclic group.

The divalent heterocyclic group preferably has a 5- or 6-membered ring as the heterocyclic ring. Another heterocyclic ring, an aliphatic ring, or an aromatic ring may be fused with the heterocyclic ring. The heterocyclic group may have a substituent. Examples of the substituent include a halogen atom, a hydroxyl group, an oxo group (═O), a thioxo group (═S), an imino group (═NH), a substituted imino group (═N—R$^{32}$ where R$^{32}$ represents an aliphatic group, an aromatic group, or a heterocyclic group), an aliphatic group, an aromatic group, and a heterocyclic group.

L is preferably a single bond, an alkylene group, or a divalent linking group containing an oxyalkylene structure. The oxyalkylene structure is more preferably an oxyethylene structure or an oxypropylene structure. Furthermore, L may contain a polyoxyalkylene structure containing two or more repeating oxyalkylene structures. The polyoxyalkylene structure is preferably a polyoxyethylene structure or a polyoxypropylene structure. The polyoxyethylene structure is represented by —(OCH$_2$CH$_2$)n- where n is preferably an integer of 2 or more and more preferably an integer of 2 to 10.

Examples of Z include an aliphatic group (for example, an alkyl group, a substituted alkyl group, an unsaturated alkyl group, or a substituted unsaturated alkyl group), an aromatic group (for example, an aryl group or a substituted aryl group), a heterocyclic group, and a combination thereof. These groups may contain an oxygen atom (—O—), a sulfur atom (—S—), an imino group (—NH—), a substituted imino group (—NR$^{31}$— where R$^{31}$ represents an aliphatic group, an aromatic group, or a heterocyclic group), or a carbonyl group (—CO—).

The aliphatic group may be branched or cyclic. The number of carbon atoms in the aliphatic group is preferably 1 to 20, more preferably 1 to 15, and still more preferably 1 to 10. A ring assembly hydrocarbon group or a crosslinked cyclic hydrocarbon group is further included in the aliphatic group. Examples of the ring assembly hydrocarbon group include a bicyclohexyl group, a perhydronaphthalenyl group, a biphenyl group, and a 4-cyclohexylphenyl group. Examples of the crosslinked cyclic hydrocarbon ring include bicyclic hydrocarbon rings such as pinane, bornane, norpinane, norbornane, and bicyclooctane rings (bicyclo[2.2.2]octane ring, bicyclo[3.2.1]octane ring, and the like), tricyclic hydrocarbon rings such as homobredane, adamantane, tricyclo[5.2.1.0$^{2,6}$]decane, and tricyclo[4.3.1.1$^{2,5}$]undecane rings, and tetracyclic hydrocarbon rings such as tetracyclo[4.4.0.1$^{2,5}$.1$^{7,10}$]dodecane and perhydro-1,4-methano-5,8-methanonaphthalene rings. In addition, the crosslinked cyclic hydrocarbon rings include fused cyclic hydrocarbon rings, for example, fused rings formed by condensing a plurality of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene rings.

As for the aliphatic group, a saturated aliphatic group is more preferred than an unsaturated aliphatic group. The aliphatic group may have a substituent. Examples of the substituent include a halogen atom, an aromatic group, and a heterocyclic group. However, the aliphatic group contains no acid group as a substituent.

The number of carbon atoms in the aromatic group is preferably 6 to 20, more preferably 6 to 15, and still more preferably 6 to 10. The aromatic group may have a substituent. Examples of the substituent include a halogen atom, an aliphatic group, an aromatic group, and a heterocyclic group. However, the aromatic group has no acid group as a substituent.

The heterocyclic group preferably has a 5- or 6-membered ring as the heterocyclic ring. Another heterocyclic ring, an aliphatic ring, or an aromatic ring may be fused with the heterocyclic ring. The heterocyclic group may have a substituent. Examples of the substituent include a halogen atom, a hydroxyl group, an oxo group (═O), a thioxo group (═S), an imino group (═NH), a substituted imino group (═N—

$R^{32}$ where $R^{32}$ is an aliphatic group, an aromatic group, or a heterocyclic group), an aliphatic group, an aromatic group, and a heterocyclic group. However, the heterocyclic group has no acid group as a substituent.

In General Formula (iii), $R^4$, $R^5$, and $R^6$ each independently represent a hydrogen atom, a halogen atom (for example, a fluorine atom, a chlorine atom, or a bromine atom), an alkyl group having 1 to 6 carbon atoms (for example, a methyl group, an ethyl group, or a propyl group), Z, or -L-Z. Here, L and Z have the same definition as above. As for $R^4$, $R^5$, and $R^6$, a hydrogen atom or an alkyl group having 1 to 3 carbon atoms is preferred, and a hydrogen atom is more preferred.

The monomer represented by General Formula (i) is preferably a compound in which $R^1$, $R^2$, and $R^3$ are a hydrogen atom or a methyl group, L is a single bond, an alkylene group, or divalent linking group containing an oxyalkylene structure, X is an oxygen atom or an imino group, and Z is an aliphatic group, a heterocyclic group, or an aromatic group.

The monomer represented by General Formula (ii) is preferably a compound in which $R^1$ is a hydrogen atom or a methyl group, L is an alkylene group, and Z is an aliphatic group, a heterocyclic group, or an aromatic group.

The monomer represented by General Formula (iii) is preferably a compound in which $R^4$, $R^5$, and $R^6$ are a hydrogen atom or a methyl group and Z is an aliphatic group, a heterocyclic group, or an aromatic group.

Examples of representative compounds represented by General Formulae (i) to (iii) include radical polymerizable compounds selected from acrylic acid esters, methacrylic acid esters, styrenes, and the like.

Regarding examples of representative compounds represented by General Formulae (i) to (iii), reference can be made to the compounds described in paragraphs [0089] to [0093] of JP2013-249417A, the contents of which are incorporated herein by reference in its entirety.

The content of the hydrophobic structural unit in the second resin is preferably 0 to 80 mol % and more preferably 0 to 60 mol % with respect to the total structural units.

The second resin may have a functional group capable of forming an interaction with a pigment (in particular, a black pigment such as titanium black). Here, it is preferred that the second resin further contains a structural unit having a functional group capable of forming an interaction with a pigment.

Examples of the functional group capable of forming an interaction with a pigment include an acid group, a basic group, a coordinating group, and a reactive functional group.

In the case where the second resin has an acid group, a basic group, a coordinating group, or a reactive functional group, it is preferred to contain a structural unit having an acid group, a structural unit having a basic group, a structural unit having a coordinating group, or a structural unit having a reactive functional group, respectively.

In particular, by further including an alkali-soluble group such as a carboxylic acid group as an acid group in the second resin, developability for pattern formation through alkaline development is further improved in the second resin.

By including a structural unit having an acid group in the second resin, the second resin is likely to be compatible with a solvent, so that the coatability also tends to be improved.

This is assumed to be due to the fact that the acid group in the structural unit having an acid group is likely to interact with the pigment, so that the second resin stably disperses the pigment; and the viscosity of the second resin for dispersing the pigment is reduced, so that the second resin itself is likely to be stably dispersed.

The structural unit having an alkali-soluble group as the acid group may be the same as or different from the above-mentioned structural unit having a linear alkylene group having 4 or more carbon atoms. However, the structural unit having an alkali-soluble group as the acid group is a structural unit different from the above-mentioned hydrophobic structural unit (that is, the structural unit having an alkali-soluble group as the acid group does not correspond to the above-mentioned hydrophobic structural unit).

Examples of the acid group include a carboxylic acid group, a sulfonic acid group, a phosphoric acid group, and a phenolic hydroxyl group. A carboxylic acid group, a sulfonic acid group, or a phosphoric acid group is preferable. A carboxylic acid group is more preferable from the viewpoint of good adsorption force to a pigment and high dispersibility of a pigment.

That is, it is preferred that the second resin further has a structural unit having at least one of a carboxylic acid group, a sulfonic acid group, or a phosphoric acid group.

The second resin may have one or two or more structural units having an acid group.

In the case where the second resin contains a structural unit having an acid group, the content of the structural unit having an acid group is preferably 5 to 80 mol % with respect to the total structural units and more preferably 10 to 60 mol % from the viewpoint of inhibiting damage to image intensity caused by alkaline development.

Examples of the basic group include a primary amino group, a secondary amino group, a tertiary amino group, a hetero ring containing an N atom, and an amido group. A tertiary amino group is preferable from the viewpoint of good adsorption force to a pigment and high dispersibility of a pigment. The second resin may have one or two or more such basic groups.

In the case where the second resin contains a structural unit having a basic group, the content of the structural unit having a basic group is preferably 0.01 to 50 mol % with respect to the total structural units, and more preferably 0.01 to 30 mol % from the viewpoint of reducing the development inhibition.

Examples of the coordinating group and the reactive functional group, each of which is a functional group capable of forming an interaction with a pigment, include an acetylacetoxy group, a trialkoxysilyl group, an isocyanate group, an acid anhydride, and an acid chloride. Among them, an acetylacetoxy group is preferable from the viewpoint of good adsorption force to a pigment and high dispersibility of a pigment. The second resin may have one or two or more of these groups.

In the case where the second resin contains a structural unit having a coordinating group, the content of the structural unit having a coordinating group is preferably 5 to 80 mol % with respect to the total structural units, and more preferably 20 to 60 mol % from the viewpoint of reducing the development inhibition.

Although the structural units contained in the second resin have been described above, more specifically, the second resin preferably contains one or more structural units selected from structural units derived from monomers represented by General Formulae (iv) to (vi).

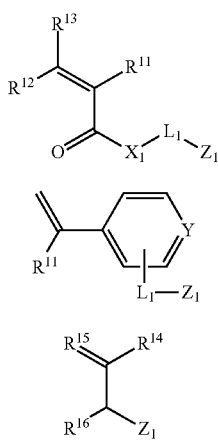

In General Formulae (iv) to (vi), $R^{11}$, $R^{12}$, and $R^{13}$ each independently represent a hydrogen atom, a halogen atom (for example, a fluorine atom, a chlorine atom, or a bromine atom), or an alkyl group (for example, a methyl group, an ethyl group, or a propyl group) having 1 to 6 carbon atoms.

In General Formulae (iv) to (vi), it is preferred that $R^{11}$, $R^{12}$, and $R^{13}$ are each independently a hydrogen atom or an alkyl group having 1 to 3 carbon atoms, and it is more preferred that $R^{11}$, $R^{12}$, and $R^{13}$ are each independently a hydrogen atom or a methyl group. In General Formula (iv), it is still more preferred that $R^{12}$ and $R^{13}$ are each a hydrogen atom.

In General Formula (iv), $X_1$ represents an oxygen atom (—O—) or an imino group (—NH—), and is preferably an oxygen atom.

In General Formula (v), Y represents a methine group or a nitrogen atom.

In General Formulae (iv) to (v), $L_1$ represents a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), a divalent heterocyclic group, an oxygen atom (—O—), a sulfur atom (—S—), an imino group (—NH—), a substituted imino bond (—NR$^{31'}$— where R$^{31'}$ is an aliphatic group, an aromatic group, or a heterocyclic group), a carbonyl bond (—CO—), and a combination thereof.

The divalent aliphatic group may be branched or cyclic. The number of carbon atoms in the aliphatic group is preferably 1 to 20, more preferably 1 to 15, and still more preferably 1 to 10. The aliphatic group is preferably a saturated aliphatic group rather than an unsaturated aliphatic group. The aliphatic group may have a substituent. Examples of the substituent include a halogen atom, a hydroxyl group, an aromatic group, and a heterocyclic group.

The number of carbon atoms in the divalent aromatic group is preferably 6 to 20, more preferably 6 to 15, and still more preferably 6 to 10. The aromatic group may have a substituent. Examples of the substituent include a halogen atom, a hydroxyl group, an aliphatic group, an aromatic group, and a heterocyclic group.

The divalent heterocyclic group preferably has a 5- or 6-membered ring as the heterocyclic ring. One or more of another heterocyclic ring, aliphatic ring, or aromatic ring may be fused with the heterocyclic ring. The heterocyclic group may have a substituent. Examples of the substituent include a halogen atom, a hydroxyl group, an oxo group (=O), a thioxo group (=S), an imino group (=NH), a substituted imino group (=N—R$^{32}$ where R$^{32}$ represents an aliphatic group, an aromatic group, or a heterocyclic group), an aliphatic group, an aromatic group, and a heterocyclic group.

It is preferred that $L_1$ is a single bond, an alkylene group, or a divalent linking group containing an oxyalkylene structure. It is more preferred that the oxyalkylene structure is an oxyethylene structure or an oxypropylene structure. Furthermore, L may contain a polyoxyalkylene structure containing two or more repeating oxyalkylene structures. As for the polyoxyalkylene structure, a polyoxyethylene structure or a polyoxypropylene structure is preferred. The polyoxyethylene structure is represented by —(OCH$_2$CH$_2$)n- where n is preferably an integer of 2 or more and more preferably an integer of 2 to 10.

In General Formulae (iv) to (vi), $Z_1$ represents a functional group capable of forming an interaction with a pigment, and is preferably a carboxylic acid group or a tertiary amino group and more preferably a carboxylic acid group.

In General Formula (vi), $R^{14}$, $R^{15}$, and $R^{16}$ each independently represent a hydrogen atom, a halogen atom (for example, a fluorine atom, a chlorine atom, or a bromine atom), an alkyl group having 1 to 6 carbon atoms (for example, a methyl group, an ethyl group, or a propyl group), -$Z_1$, or -$L_1$-$Z_1$. Here, $L_1$ and $Z_1$ have the same definition as $L_1$ and $Z_1$ described above, and the same will also apply to the preferred ranges thereof. $R^{14}$, $R^{15}$, and $R^{16}$ are each independently preferably a hydrogen atom or an alkyl group having 1 to 3 carbon atoms and more preferably a hydrogen atom.

The monomer represented by General Formula (iv) is preferably a compound in which $R^{11}$, $R^{12}$, and $R^{13}$ are each independently a hydrogen atom or a methyl group, $L_1$ is an alkylene group or a divalent linking group containing an oxyalkylene structure, X is an oxygen atom or an imino group, and Z is a carboxylic acid group.

The monomer represented by General Formula (v) is preferably a compound in which $R^{11}$ is a hydrogen atom or a methyl group, $L_1$ is an alkylene group, $Z_1$ is a carboxylic acid group, and Y is a methine group.

The monomer represented by General Formula (vi) is preferably a compound in which $R^{14}$, $R^{15}$, and $R^{16}$ are each independently a hydrogen atom or a methyl group, L is a single bond or an alkylene group, and Z is a carboxylic acid group.

Representative examples of the monomers (compounds) represented by General Formulae (iv) to (vi) are shown below.

Examples of the monomers include methacrylic acid, crotonic acid, isocrotonic acid, a reaction product of a succinic anhydride with a compound (for example, 2-hydroxyethyl methacrylate) having an addition-polymerizable double bond and a hydroxyl group in the molecule, a reaction product of a phthalic anhydride with a compound having an addition-polymerizable double bond and a hydroxyl group in the molecule, a reaction product of a tetrahydroxy phthalic anhydride with a compound having an addition-polymerizable double bond and a hydroxyl group in the molecule, a reaction product of a trimellitic anhydride with a compound having an addition-polymerizable double bond and a hydroxyl group in the molecule, a reaction product of a pyromellitic anhydride with a compound having an addition-polymerizable double bond and a hydroxyl group in the molecule, acrylic acid, an acrylic acid dimer, an acrylic acid oligomer, maleic acid, itaconic acid, fumaric acid, 4-vinyl benzoic acid, vinyl phenol, and 4-hydroxyphenyl methacrylamide.

The acid value of the second resin is preferably 0 to 160 mgKOH/g, more preferably 10 to 140 mgKOH/g, and still more preferably 20 to 120 mgKOH/g.

In the case where the acid value of the second resin is 160 mgKOH/g or less, peeling of the pattern during the development at the time of forming a resin film is more effectively inhibited. In the case where the acid value of the second resin is 10 mgKOH/g or more, the alkali developability is improved. In the case where the acid value of the second resin is 20 mgKOH/g or more, precipitation of the dispersoid containing a pigment (particularly, titanium black) can be further inhibited, so that the number of coarse particles can be further reduced and the temporal stability of the composition can be further improved.

In the present invention, the acid value of the second resin can be calculated from, for example, the average content of the acid groups in the second resin. A resin having a desired acid value can be obtained by changing the content of a structural unit containing an acid group, which is a constituent of the second resin.

From the viewpoint that the effects of the present invention are excellent, the weight-average molecular weight of the second resin is preferably 4,000 to 300,000, more preferably 5,000 to 200,000, still more preferably 6,000 to 100,000, and particularly preferably 10,000 to 50,000, in terms of polystyrene as measured by the GPC (Gel Permeation Chromatography) method.

The conditions for the GPC method are the same as those for the above-mentioned method of measuring the weight-average molecular weight of the first resin.

The second resin can be synthesized by a known method.

The content of the second resin in the composition is not particularly limited, but it is preferably 2 to 50 mass % and more preferably 4 to 20 mass % with respect to the total solid content of the composition, from the viewpoint that the effects of the present invention are excellent.

The mass ratio between the mass of the first resin and the mass of the second resin (mass of first resin/mass of second resin) in the composition is not particularly limited, but it is preferably 0.04 to 10 and more preferably 0.2 to 5 from the viewpoint that the effects of the present invention are excellent.

In particular, a suitable range of the above-mentioned mass ratio varies depending on the type of a coloring agent in the composition. For example, in the case where titanium black is used as the coloring agent, the above-mentioned mass ratio is preferably 0.1 to 6 and more preferably 0.5 to 4.

In the case where carbon black is used as the coloring agent, the above-mentioned mass ratio is preferably 0.2 to 8 and more preferably 0.8 to 5.

(Coloring Agent)

A variety of known coloring pigments and coloring dyes can be used as the coloring agent.

In the case where the coloring dye is used, for example, for the production of a color filter, coloring agents described in paragraphs [0027] to [0200] of JP2014-42375A can be used in addition to chromatic color-based dyes (chromatic color dyes) such as R (red), G (green), and B (blue) dyes for forming color pixels of a color filter. Black color dyes (black dyes) commonly used for the formation of a black matrix or the formation of a light shielding film can also be used.

In the case where the coloring pigment is used, for example, for the production of a color filter, chromatic color-based pigments (chromatic color pigments) such as R (red), G (green), and B (blue) pigments for forming color pixels of a color filter can be used. Black color pigments (black pigments) commonly used for the formation of a black matrix or the formation of a light shielding film can also be used.

A variety of conventionally known inorganic pigments or organic pigments can be used as the pigment.

Considering that a pigment having a high transmittance is preferable regardless of whether or not the pigment is an inorganic pigment or an organic pigment, it is preferable to be as fine as possible, and also in consideration of handleability, the average primary particle diameter of the pigment is preferably 0.01 to 0.1 µm and more preferably 0.01 to 0.05 µm.

The average primary particle diameter of the pigment can be measured using a transmission electron microscope (TEM). For example, a transmission electron microscope HT7700 (manufactured by Hitachi High-Technologies Corporation) can be used as the transmission electron microscope.

The maximum length (Dmax: maximum length at two points on the outline of the particle image) of the particle image obtained by using a transmission electron microscope and the maximum longest vertical length (DV-max: the shortest length connecting two straight lines vertically in the case of an image being sandwiched between two straight lines parallel to the maximum length) is measured, and the geometric mean value $(Dmax \times DV\text{-}max)^{1/2}$ is taken as the particle diameter. The particle diameter of 100 particles is measured by such a method, and the arithmetic mean value thereof is taken as the average particle diameter, which is then taken as the average primary particle diameter of the pigment.

Examples of the inorganic pigment include metal compounds such as metal oxides and metal complex salts, specific examples of which include oxides of metals such as iron, cobalt, aluminum, cadmium, lead, copper, titanium, magnesium, chromium, zinc, and antimony, and complex oxides of the foregoing metals. Examples of the organic pigment include the following pigments. However, the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. Pigment Green 7, 10, 36, 37, 58, and 59, C. I. Pigment Violet 1, 19, 23, 27, 32, 37, and 42, C. I. Pigment Blue 1, 2, 15, 15:1, 15:2, 15:3, 15:4, 15:6, 16, 22, 60, 64, 66, 79, and 80.

These organic pigments can be used singly or in various combinations for increasing color purity.

(Black Pigment)

In the present invention, a black pigment may be used as the pigment. Hereinafter, the black pigment will be described in more detail.

A variety of known black pigments can be used as the black pigment. In particular, from the viewpoint of achieving a high optical density with a small amount, carbon black, titanium black, titanium oxide, iron oxide, manganese oxide, or graphite is preferable, and carbon black or titanium black is more preferable. From the viewpoint of less absorption in the light absorption wavelength range of the initiator related to curing efficiency by exposure, titanium black is still more preferable. Specific examples of carbon black include commercially available products, for example, organic pigments such as C. I. Pigment Black 1 and inorganic pigments such as C. I. Pigment Black 7.

(Other Pigments)

In the present invention, a pigment having infrared absorptivity other than the pigment described as a black pigment may also be used as the pigment.

The pigment having infrared absorptivity is preferably a tungsten compound, a metal boride, or the like. A tungsten compound is more preferable from the viewpoint of excellent light shielding properties at a wavelength in the infrared region.

These pigments may be used in combination of two or more thereof or may be used in combination with a dye to be described later. In order to adjust the tint or to enhance the light shielding properties in a desired wavelength range, for example, there is an aspect in which the foregoing chromatic color pigment such as a red, green, yellow, orange, violet, or blue pigment or a dye to be described later is in admixture with a pigment having black color or infrared shielding properties. It is preferable to mix a red pigment or dye and a violet pigment or dye with a black or infrared shielding pigment, and it is more preferable to mix a red pigment with a black or infrared shielding pigment.

Titanium black is preferable as the black pigment.

The titanium black is black particles containing titanium atoms. The titanium black is preferably low-order titanium oxide or titanium oxynitride. The surfaces of titanium black particles may be modified as necessary for the purpose of improving dispersibility or inhibiting aggregating properties. The titanium black may be coated with silicon oxide, titanium oxide, germanium oxide, aluminum oxide, magnesium oxide, or zirconium oxide. The titanium black can also be treated with a water repellent material as disclosed in JP2007-302836A.

Typically, the titanium black is titanium black particles. It is preferred that both the primary particle diameter and the average primary particle diameter of individual particles are small.

Specifically, those having an average primary particle diameter in the range of 10 to 45 nm are preferable.

The specific surface area of the titanium black is not particularly limited, but the value measured by a Brunauer, Emmett and Teller's (BET) method is preferably 5 to 150 $m^2/g$ and more preferably 20 to 120 $m^2/g$ so that the water repellency of the titanium black after the surface treatment with a water repellent agent becomes a predetermined performance.

Examples of commercially available titanium black include titanium blacks 10S, 12S, 13R, 13M, 13M-C, 13R, 13R-N, and 13M-T (trade name, all manufactured by Mitsubishi Materials Corporation), and Tilack D (trade name, manufactured by Akokasei Co., Ltd.).

It is also preferable to contain titanium black as a dispersoid containing titanium black and Si atoms.

In this aspect, the titanium black is contained as a dispersoid in the composition, and a content ratio of Si atoms to Ti atoms (Si/Ti) in the dispersoid is preferably 0.05 or more, more preferably 0.05 to 0.5, and still more preferably 0.07 to 0.4 in terms of mass.

Here, the above-mentioned dispersoid includes both titanium black in a state of primary particles and titanium black in a state of aggregates (secondary particles).

To change the Si/Ti of the dispersoid (for example, to 0.05 or more), it is possible to use the following means.

First, a dispersion is obtained by dispersing titanium oxide and silica particles with a dispersing machine and then the dispersion is subjected to a reduction treatment at a high temperature (for example, 850° C. to 1000° C.), whereby a dispersoid containing titanium black particles as a main component and containing Si and Ti can be obtained. The reduction treatment can also be carried out under an atmosphere of a reducing gas such as ammonia.

An example of titanium oxide may be TTO-51N (trade name, manufactured by Ishihara Sangyo Kaisha Ltd.).

Examples of commercially available products of silica particles include AEROSIL (registered trademark) 90, 130, 150, 200, 255, 300, and 380 (trade name: manufactured by Evonik Industries AG).

The dispersion may be carried out in a solvent. Examples of the solvent include water and an organic solvent. Regarding the organic solvent, reference can be made to those described in the section of the organic solvent to be described later.

The titanium black with the Si/Ti adjusted to, for example, 0.05 or more can be produced by the method described in, for example, paragraphs [0005] and [0016] to [0021] in JP2008-266045A.

By adjusting the content ratio of Si atoms to Ti atoms (Si/Ti) in the dispersoid containing titanium black and Si atoms to a suitable range (for example, 0.05 or more), in the case where a light shielding film is formed using the composition containing such dispersoid, an amount of the residue derived from the composition, remaining on the outside of a region where the light shielding film is formed, is reduced. Note that the residue includes components derived from a composition, such as titanium black particles and resin components.

Although the reason why an amount of the residue is reduced has not been clarified yet, it is presumed as follows: the above-mentioned dispersoid tends to have a small particle diameter (for example, a particle diameter of 30 nm or less), and the adsorbability of the entire film to the underlayer is reduced as the component containing Si atoms increases in the dispersoid, which contributes to improvement of the development removability of uncured composition (particularly, titanium black) in the formation of the light shielding film.

Since the titanium black exhibits excellent light shielding properties against light in a wavelength range over a wide range from ultraviolet to infrared, the light shielding film formed from the dispersoid containing titanium black and Si atoms (preferably with the Si/Ti of 0.05 or more in terms of mass) exhibits excellent light shielding properties.

Note that the content ratio of Si atoms to Ti atoms (Si/Ti) in the dispersoid can be measured, for example, according to the method (1-1) or (1-2) described in paragraph [0033] of JP2013-249417A.

Further, in order to determine whether or not the content ratio of Si atoms to Ti atoms (Si/Ti) in the dispersoid contained in the light shielding film obtained by curing the composition is 0.05 or more, the method (2) described in paragraph [0035] of JP2013-249417A is used.

In the dispersoid containing titanium black and Si atoms, the above-mentioned titanium black can be used.

Further, in the dispersoid, one or two or more types of a composite oxide of Cu, Fe, Mn, V, Ni, or the like, cobalt oxide, iron oxide, and a black pigment made of carbon black, aniline black, or the like may be combined as the dispersoid together with the titanium black, for the purpose of adjusting dispersibility, colorability, and the like.

In this case, it is preferred that the dispersoid made of the titanium black accounts for 50 mass % or more of the entire dispersoid.

Further, in the dispersoid, another coloring agent (such as an organic pigment or dye) may be used together with the titanium black as desired for the purpose of adjusting light shielding properties as long as the coloring agent does not impair the effects of the present invention.

Hereinafter, the materials used for introducing Si atoms into the dispersoid will be described. In the case where Si atoms are introduced into the dispersoid, a Si-containing material such as silica may be used.

Examples of the silica that can be used in the present invention include precipitated silica, fumed silica, colloidal silica, synthetic silica, and the like, which may be appropriately selected and used.

Furthermore, it is preferable to use fine particle type silica as the silica particles since the light shielding properties are excellent in the case where the particle diameter of the silica particles is smaller than the film thickness in the case where a light shielding film is formed. The fine particle type silica may be, for example, the silica described in paragraph [0039] of JP2013-249417A, the contents of which are incorporated herein by reference in its entirety.

A tungsten compound and a metal boride can also be used as the pigment.

Hereinafter, the tungsten compound and the metal boride will be described in detail.

The tungsten compound and the metal boride are infrared shielding materials which have high absorption with respect to infrared rays (light having a wavelength of about 800 to 1200 nm) (that is, having high light shielding properties (shielding properties) against infrared rays) and have low absorption with respect to visible light. Therefore, in the case where the composition contains a tungsten compound and/or a metal boride, it is possible to form a pattern having high light shielding properties in the infrared region and high translucency in the visible light region.

In addition, the tungsten compound and the metal boride have small absorption also for light having a shorter wavelength than the visible region used for exposure, such as a high pressure mercury lamp, KrF, or ArF which is used for the formation of an image. Therefore, an excellent pattern can be obtained, and development residues can be further reduced in the formation of a pattern.

Examples of the tungsten compound include a tungsten oxide-based compound, a tungsten boride-based compound, and a tungsten sulfide-based compound, among which a tungsten oxide-based compound represented by General Formula (Composition Formula) (I) is preferable.

$$M_xW_yO_z \quad (I)$$

In the general formula, M represents a metal, W represents tungsten, and O represents oxygen.

$$0.001 \leq x/y \leq 1.1$$

$$2.2 \leq z/y \leq 3.0$$

Examples of the metal M include an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi, among which an alkali metal is preferable. The number of the metals M may be one or may be two or more.

M is preferably an alkali metal, more preferably Rb or Cs, and still more preferably Cs.

In the case where x/y is 0.001 or more, it is possible to sufficiently shield infrared rays and, in the case where x/y is 1.1 or less, it is possible to more reliably avoid the generation of impurity phases in the tungsten compound.

In the case where z/y is 2.2 or more, it is possible to further improve chemical stability as a material and, in the case where z/y is 3.0 or less, it is possible to sufficiently shield infrared rays.

Specific examples of the tungsten oxide-based compound represented by General Formula (I) include $Cs_{0.33}WO_3$, $Rb_{0.33}WO_3$, $K_{0.33}WO_3$, and $Ba_{0.33}WO_3$, among which $Cs_{0.33}WO_3$ or $Rb_{0.33}WO_3$ is preferable and $Cs_{0.33}WO_3$ is more preferable.

The tungsten compound is preferably fine particles. The average particle diameter of the tungsten fine particles is preferably 800 nm or less, more preferably 400 nm or less, and still more preferably 200 nm or less. In the case where the average particle diameter is within the above-specified range, the tungsten fine particles are not capable of easily shielding visible light because of light scattering, so that light translucency in the visible light region can be more successfully ensured. From the viewpoint of avoiding light scattering, the average particle diameter is preferably as small as possible; however, in consideration of ease of handling at the time of production, the average particle diameter of the tungsten fine particles is usually 1 nm or more.

In addition, two or more tungsten compounds can be used.

The tungsten compound is available as a commercially available product, but in the case where the tungsten compound is, for example, a tungsten oxide-based compound, the tungsten oxide-based compound can be obtained by a method in which a tungsten compound is subjected to a heat treatment in an inert gas atmosphere or in a reductive gas atmosphere (see JP4096205B).

In addition, the tungsten oxide-based compound is also available as a dispersion of tungsten fine particles such as YMF-02 manufactured by Sumitomo Metal Mining Co., Ltd, for example.

The metal boride may be one member or two or more members selected from lanthanum boride ($LaB_6$), praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB$, $CrB_2$), molybdenum boride ($MoB_2$, $Mo_2B_5$, $MoB$), and tungsten boride ($W_2B_5$). The metal boride is preferably lanthanum boride ($LaB_6$).

The metal boride is preferably fine particles. The average particle diameter of the metal boride fine particles is preferably 800 nm or less, more preferably 300 nm or less, and still more preferably 100 nm or less. In the case where the average particle diameter is within the above-specified range, the metal boride fine particles are not capable of easily shielding visible light because of light scattering, so that light translucency in the visible light region can be more successfully ensured. From the viewpoint of avoiding light scattering, the average particle diameter is preferably smaller, but for the reason of easy handling or the like at the time of production, the average particle diameter of the metal boride fine particles is usually 1 nm or more.

Two or more metal borides can be used.

The metal boride is available as a commercial product and is available also as a dispersion of metal boride fine particles such as KHF-7 (manufactured by Sumitomo Metal Mining Co., Ltd.), for example.

(Dye)

Examples of the dye that can be used in the present invention include the colorants disclosed in JP1989-90403A (JP-S64-90403A), JP1989-91102A (JP-S64-91102A), JP1989-94301A (JP-H01-94301A), JP1994-11614A (JP-H06-1614A), JP2592207B, U.S. Pat. Nos. 4,808,501A, 5,667,920A, 505,950A, JP1993-333207A (JP-H05-333207A), JP1994-35183A (JP-H06-35183A), JP1994-51115A (JP-H06-51115A), JP1994-194828A (JP-H06-194828A), and the like. In terms of classification based on the chemical structure, a pyrazole azo compound, a pyrromethene compound, an aniline azo compound, a triphenylmethane compound, an anthraquinone compound, a benzylidene compound, an oxonol compound, a pyrazolotriazole azo compound, a pyridine azo compound, a cyanine compound, a phenothiazine compound, a pyrrolopyrazole azomethine compound, and the like can be used. Further, a colorant multimer may be used as the dye. Examples of the colorant multimer include the compounds described in JP2011-213925A and JP2013-041097A.

In the present invention, a coloring agent having an absorption maximum in the wavelength range of 800 to 900 nm can be used as the coloring agent.

Examples of the coloring agent having such spectral characteristics include a pyrrolopyrrole compound, a copper compound, a cyanine compound, a phthalocyanine compound, an iminium compound, a thiol complex-based compound, a transition metal oxide-based compound, a squarylium compound, a naphthalocyanine compound, a quaterrylene compound, a dithiol metal complex-based compound, and a croconium compound.

For the phthalocyanine compound, the naphthalocyanine compound, the iminium compound, the cyanine compound, the squarylium compound, and the croconium compound, it may be possible to use the compounds disclosed in paragraphs [0010] to [0081] of JP2010-111750A, the contents of which are incorporated herein by reference in its entirety. The cyanine compound can be referred to, for example, "Functional Colorant, written by OKAWARA Makoto/MATSUOKA Masaru/KITAO Teijiro/HIRASHIMA Tsuneaki and published by Kodansha Scientific Ltd.", the contents of which are incorporated herein by reference in its entirety.

As the coloring agent having the above-mentioned spectral characteristics, the compounds disclosed in paragraphs [0004] to [0016] of JP1995-164729A (JP-H07-164729A), the compounds disclosed in paragraphs [0027] to [0062] of JP2002-146254A, and near infrared absorbing particles made of crystallites of oxides containing Cu and/or P and having a number average aggregated particle diameter of 5 to 200 nm disclosed in paragraphs [0034] to [0067] of JP2011-164583A can be used.

In the present invention, the coloring agent having an absorption maximum in the wavelength range of 800 to 900 nm is preferably a pyrrolopyrrole compound. The pyrrolopyrrole compound may be a pigment or a dye, but the pyrrolopyrrole compound is preferably a pigment from the viewpoint that it is easy to obtain a composition capable of forming a resin film having excellent heat resistance.

For the details of the pyrrolopyrrole compound, reference can be made to the description of paragraphs [0017] to [0047] of JP2009-263614A, the contents of which are incorporated herein by reference in its entirety. Specific examples of the pyrrolopyrrole compound include the compounds described in paragraphs [0049] to [0058] of JP2009-263614A, the contents of which are incorporated herein by reference in its entirety.

Further, the dye multimers described in paragraphs [0027] to [0200] of JP2014-199436A can also be suitably used. Among them, those having a partial structure derived from a xanthene colorant (xanthene compound) are preferable.

Further, the composition may contain an extender pigment as necessary. Examples of the extender pigment include barium sulfate, barium carbonate, calcium carbonate, silica, basic magnesium carbonate, alumina white, gloss white, titanium white, and hydrotalcite. These extender pigments may be used alone or in combination of two or more thereof. The amount of the extender pigment used is usually 0 to 100 parts by mass, preferably 5 to 50 parts by mass, and more preferably 10 to 40 parts by mass, with respect to 100 parts by mass of the coloring agent. In the present invention, the surfaces of the coloring agent and extender pigment may be optionally modified with a polymer.

Further, in addition to a black pigment or a pigment exhibiting an excellent transmittance of light having a wavelength in the visible light region and an excellent function of shielding light having a wavelength in the infrared region, the composition may contain a coloring organic pigment such as a red, blue, yellow, green, or violet pigment or dye, as necessary. In the case of using a coloring organic pigment or dye in combination with a black pigment or a pigment exhibiting an excellent transmittance of light having a wavelength in the visible light region and an excellent function of shielding light having a wavelength in the infrared region, a red pigment or a red dye is preferably used in an amount of 1 to 40 mass % with respect to the black pigment or the pigment exhibiting an excellent transmittance of light having a wavelength in the visible light region and an excellent function of shielding light having a wavelength in the infrared region. The red pigment or the red dye is preferably Pigment Red 254.

The content of the coloring agent in the composition is not particularly limited, but it is preferably 10 to 75 mass %, more preferably 12 to 65 mass %, still more preferably 15 to 60 mass %, particularly preferably 25 to 60 mass %, and most preferably 30 to 60 mass % with respect to the total solid content of the composition, from the viewpoint that the effects of the present invention are excellent.

<Photoacid Generator (Compound Capable of Generating Acid Upon Irradiation with Actinic Rays)>

The composition of the present invention contains a photoacid generator.

The photoacid generator is preferably a compound capable of generating an acid in response to actinic rays having a wavelength of 300 nm or longer and preferably a wavelength of 300 to 450 nm, but there is no limitation on the chemical structure thereof. Even a photoacid generator which is not directly sensitive to actinic rays having a wavelength of 300 nm or longer may be preferably used in combination with a sensitizer, as long as the photoacid generator is a compound which is capable of generating an acid in response to actinic rays or radiation having a wavelength of 300 nm or longer in the case of being used in combination with such a sensitizer. For example, the photoacid generator is preferably a compound capable of generating an organic acid such as onium salt, sulfonic acid, bis(alkylsulfonyl)imide, or tris(alkylsulfonyl)methide.

Specifically, examples of the photoacid generator include compounds represented by General Formulae (ZI), (ZII), and (ZII).

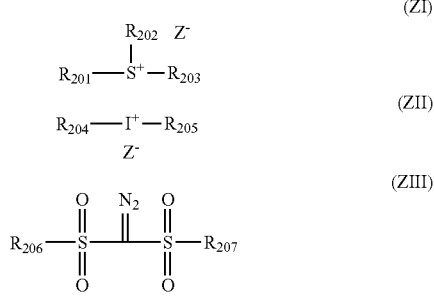

In General Formula (ZI), $R_{201}$, $R_{202}$, and $R_{203}$ each independently represent an organic group.

The organic group represented by $R_{201}$, $R_{202}$, or $R_{203}$ generally has 1 to 30 carbon atoms and preferably 1 to 20 carbon atoms.

Any two of $R_{201}$ to $R_{203}$ may be bonded to each other to form a ring structure, and the ring may have therein an oxygen atom, a sulfur atom, an ester bond, an amide bond, or a carbonyl group. The group which may be formed by any two of $R_{201}$ to $R_{203}$ being bonded to each other may be, for example, an alkylene group (for example, a butylene group or a pentylene group).

$Z^-$ represents a non-nucleophilic anion (anion with only a very low capability of inducing a nucleophilic reaction).

Examples of the organic group represented by $R_{201}$, $R_{202}$, and $R_{203}$ include an aryl group, an alkyl group, and a cycloalkyl group.

It is preferred that at least one of $R_{201}$, $R_{202}$, or $R_{203}$ is an aryl group, and it is more preferred that all three of them are aryl groups. The aryl group may not only be a phenyl group and a naphthyl group, but also may be a heteroaryl group such as an indole residue or a pyrrole residue.

The alkyl group and cycloalkyl group represented by $R_{201}$ to $R_{203}$ are preferably a linear or branched alkyl group having 1 to 10 carbon atoms or a cyclic alkyl group having 3 to 10 carbon atoms. The linear or branched alkyl group is preferably a methyl group, an ethyl group, an n-propyl group, an i-propyl group, or an n-butyl group. The cyclic alkyl group is preferably a cyclopropyl group, a cyclobutyl group, a cyclopentyl group, a cyclohexyl group, or a cycloheptyl group.

These groups may further have a substituent. Examples of the substituent include, but are not limited to, a nitro group, a halogen atom such as a fluorine atom, a carboxylic acid group, a hydroxyl group, an amino group, a cyano group, an alkoxy group (preferably having 1 to 15 carbon atoms), a cyclic alkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Examples of the non-nucleophilic anion include a sulfonate anion (an aliphatic sulfonate anion, an aromatic sulfonate anion, a camphor sulfonate anion, or the like), a carboxylate anion (an aliphatic carboxylate anion, an aromatic carboxylate anion, an aralkyl carboxylate anion, or the like), a sulfonylimide anion, a bis(alkylsulfonyl)imide anion, and a tris(alkylsulfonyl)methide anion.

The aliphatic moiety of each of the aliphatic sulfonate anion and aliphatic carboxylate anion may be any of linear, branched, and cyclic alkyl groups, and is preferably, for example, a linear or branched alkyl group having 1 to 30 carbon atoms or a cyclic alkyl group having 3 to 30 carbon atoms.

The aromatic group in the aromatic sulfonate anion and aromatic carboxylate anion is preferably, for example, an aryl group having 6 to 14 carbon atoms, such as a phenyl group, a tolyl group, or a naphthyl group.

The above-mentioned linear, branched or cyclic alkyl group, and aryl group may have a substituent. Specific examples of the substituent include a nitro group, a halogen atom such as a fluorine atom, a carboxylic acid group, a hydroxyl group, an amino group, a cyano group, an alkoxy group (preferably having 1 to 15 carbon atoms), a cyclic alkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and cycloalkylalkyloxyalkyloxy group (preferably having 8 to 20 carbon atoms).

The aralkyl group in the aralkyl carboxylate anion is preferably an aralkyl group having 6 to 12 carbon atoms, examples of which include a benzyl group, a phenethyl group, a naphthylmethyl group, a naphthylethyl group, and a naphthylbutyl group.

The sulfonylimide anion is, for example, a saccharin anion.

The alkyl group in the bis(alkylsulfonyl)imide anion and the tris(alkylsulfonyl)methide anion is preferably an alkyl group having 1 to 5 carbon atoms. Examples of the substituent for these alkyl groups include a halogen atom, a halogen atom-substituted alkyl group, an alkoxy group, an alkylthio group, an alkyloxysulfonyl group, an aryloxysulfonyl group, and a cycloalkylaryloxysulfonyl group, among which a fluorine atom or a fluorine atom-substituted alkyl group is preferable.

The alkyl groups in the bis(alkylsulfonyl)imide anion may be bonded to each other to form a ring structure. This enhances the acid strength.

The non-nucleophilic anion is particularly an aliphatic sulfonate anion whose aliphatic moiety is a linear or branched alkyl group having 1 to 30 carbon atoms, with it being preferred that the alkyl group is fully substituted by fluorine atoms. Specifically, the non-nucleophilic anion is preferably $C_3F_7SO^{3-}$, $C_4F_9SO^{3-}$, or $C_5F_9SO^{3-}$.

In General Formulae (ZII) and (ZIII), $R_{204}$ to $R_{207}$ each independently represent an aryl group or a linear, branched or cyclic alkyl group.

The aryl group and the linear, branched or cyclic alkyl group represented by $R_{204}$ to $R_{207}$ have the same definition as in $R_{201}$ to $R_{203}$ of the compound (ZI), and the same will also apply to the preferred ranges thereof.

The aryl group and the linear, branched or cyclic alkyl group represented by $R_{204}$ to $R_{207}$ may have a substituent. The substituent has the same definition as in $R_{201}$ to $R_{203}$ of the compound (ZI), and the same will also apply to the preferred ranges thereof.

$Z^-$ represents a non-nucleophilic anion and has the same definition as in Z in General Formula (ZI), and the same will also apply to the preferred range thereof.

Specific examples of the photoacid generator are referred to the compounds described in paragraphs [0149] to [0151] and paragraphs [0170] and [0171] of JP2012-137686A, the contents of which are incorporated herein by reference in its entirety and paragraphs [0243] to [0247] of JP2012-208447A, the contents of which are incorporated herein by reference in its entirety.

The photoacid generator may also be preferably trichloromethyl-s-triazines, sulfonium salts, iodonium salts, quaternary ammonium salts, diazomethane compounds, imidosulfonate compounds, or oxime sulfonate compounds. Among them, oxime sulfonate compounds are more preferable from the viewpoint of insulating properties. Specific examples may be referred to the compounds described in paragraphs [0083] to [0088] of JP2011-221494A, the contents of which are incorporated herein by reference in its entirety.

The oxime sulfonate compound, that is, the compound having an oxime sulfonate structure, is preferably a compound having an oxime sulfonate structure represented by General Formula (B1-1).

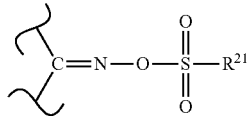

General Formula (B1-1)

(In General Formula (B1-1), $R^{21}$ represents an alkyl group or an aryl group, and a wavy line indicates a bond with another group.)

All of these groups may be substituted, and the alkyl group represented by $R^{21}$ may be linear, branched or cyclic. Acceptable substituents will be explained below.

The alkyl group represented by $R^{21}$ is preferably a linear or branched alkyl group having 1 to 10 carbon atoms. The alkyl group represented by $R^{21}$ may be substituted by a halogen atom, an aryl group having 6 to 11 carbon atoms, an alkoxy group having 1 to 10 carbon atoms, or a cycloalkyl group (including a bridged alicyclic group such as 7,7-dimethyl-2-oxonorbornyl group, preferably a bicycloalkyl group or the like).

The aryl group represented by $R^{21}$ is preferably an aryl group having 6 to 11 carbon atoms, and more preferably a phenyl group or a naphthyl group. The aryl group represented by $R^{21}$ may be substituted by a lower alkyl group, alkoxy group or a halogen atom.

Specific examples of the compound represented by General Formula (B1-1) and specific examples of the preferred oxime sulfonate compound may be referred to the description of paragraphs [0080] to [0082] of JP2012-163937A, the contents of which are incorporated herein by reference in its entirety.

These photoacid generators may be used alone or in combination of two or more thereof.

The content of the photoacid generator in the composition is not particularly limited, but it is preferably 0.1 to 20 mass %, more preferably 0.5 to 15 mass %, and still more preferably 1 to 10 mass %, with respect to the total solid content of the composition, from the viewpoint that the effects of the present invention are excellent.

<Other Components>

Components other than the first resin, the second resin, the coloring agent, and the photoacid generator may be contained in the coloring photosensitive composition. Hereinafter, optional components will be described in detail.

<Third Resin>

The composition of the present invention may contain a third resin whose solubility in an alkaline developer is improved (solubility increases) by the action of an acid. In the case where the third resin is contained in the composition, developability is further improved.

The resin whose solubility in an alkaline developer is improved by the action of an acid is not particularly limited, but it is preferably a resin having a group capable of decomposing by the action of an acid to generate an alkali-soluble group (hereinafter, also referred to as an "acid-decomposable group").

Here, the resin of the third resin is other than (different from) the first resin and the second resin.

It is preferred that the acid-decomposable group has a structure protected by a group capable of decomposing and eliminating an alkali-soluble group by the action of an acid.

Examples of the alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

The alkali-soluble group is preferably a phenolic hydroxyl group, a carboxylic acid group, a fluorinated alcohol group (preferably a hexafluoroisopropanol group), or a sulfonic acid group.

The acid-decomposable group is preferably a group substituted by a group which eliminates a hydrogen atom of an alkali-soluble group by the action of an acid.

Examples of the group eliminable by the action of an acid include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The acid-decomposable group is preferably a cumyl ester group, an enol ester group, an acetal ester group, or a tertiary alkyl ester group and more preferably an acetal ester group.

The third resin is preferably a resin containing a structural unit having an acid-decomposable group, more preferably a resin containing a structural unit represented by General Formula (1) or (V), and still more preferably a resin containing a structural unit represented by General Formula (1).

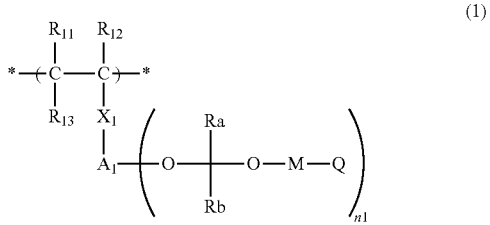

(1)

In General Formula (1)

X₁ represents a single bond or a divalent linking group.

A₁ represents a keto group or an (n1+1)-valent aromatic ring group.

$R_{11}$, $R_{12}$, and $R_{13}$ each independently represent a hydrogen atom, an alkyl group, a cycloalkyl group, a halogen atom, a cyano group, or an alkoxycarbonyl group.

$R_{13}$ may be bonded to $A_1$ to form a ring, in which case $R_{13}$ represents an alkylene group.

Ra represents a hydrogen atom, an alkyl group, a cycloalkyl group, an aryl group, an aralkyl group, or a heterocyclic group, and Rb represents a hydrogen atom, an alkyl group, a cycloalkyl group, an aryl group, an aralkyl group, or a heterocyclic group.

M represents a single bond or a divalent linking group. Q represents an alkyl group, a cycloalkyl group, an aryl group, an aralkyl group, or a heterocyclic group. Ra and Rb may be bonded to each other to form a ring. At least two of Ra, M, and Q may be bonded to each other to form a ring.

In the case where $A_1$ is a keto group, n1 represents 1, and in the case where $A_1$ is an (n+1)-valent aromatic group, n1 represents an integer of 1 to 4. In the case where n1 is 2 or more, a plurality of Ra's, a plurality of Rb's, a plurality of M's, and a plurality of Q's may be the same as or different from each other.

The alkyl group of $R_{11}$ to $R_{13}$ in General Formula (1) is preferably an alkyl group having 20 or less carbon atoms which may have a substituent (for example, a methyl group, an ethyl group, a propyl group, an isopropyl group, an n-butyl group, a sec-butyl group, a hexyl group, a 2-ethylhexyl group, an octyl group, or a dodecyl group) and more preferably an alkyl group having 8 or less carbon atoms.

The alkyl group contained in the alkoxycarbonyl group is preferably the same as the alkyl group in $R_{11}$ to $R_{13}$.

The cycloalkyl group may be monocyclic or polycyclic and is preferably a monocyclic cycloalkyl group having 3 to 10 carbon atoms which may have a substituent (for example, a cyclopropyl group, a cyclopentyl group, or a cyclohexyl group).

Examples of the halogen atom include a fluorine atom, a chlorine atom, a bromine atom, and an iodine atom, among which a fluorine atom is preferable.

Preferred examples of the substituent in each of the above-mentioned groups include an alkyl group, a cycloalkyl group, an aryl group, an amino group, an amido group, a ureido group, a urethane group, a hydroxyl group, a carboxylic acid group, a halogen atom, an alkoxy group, a thioether group, an acyl group, an acyloxy group, an alkoxycarbonyl group, a cyano group, and a nitro group, and the number of carbon atoms in the substituent is preferably 8 or less.

In the case where $R_{13}$ is an alkylene group and forms a ring with $A_1$, the alkylene group is preferably an alkylene group having 1 to 8 carbon atoms (for example, a methylene group, an ethylene group, a propylene group, a butylene group, a hexylene group, and an octylene group), more preferably an alkylene group having 1 to 4 carbon atoms, and still more preferably an alkylene group having 1 to 2 carbon atoms. The ring formed by bonding $R_{13}$ and $A_1$ to each other is preferably a 5- or 6-membered ring.

$R_{11}$ and $R_{12}$ in General Formula (1) are preferably a hydrogen atom, an alkyl group, or a halogen atom and more preferably a hydrogen atom, a methyl group, an ethyl group, a trifluoromethyl group (—CF₃), a hydroxymethyl group (—CH₂—OH), a chloromethyl group (—CH₂—Cl), or a fluorine atom (—F). $R_{13}$ is preferably a hydrogen atom, an alkyl group, a halogen atom, or an alkylene group (which forms a ring with $L_5$) and more preferably a hydrogen atom, a methyl group, an ethyl group, a trifluoromethyl group (—CF₃), a hydroxymethyl group (—CH₂—OH), a chloromethyl group (—CH₂—Cl), a fluorine atom (—F), a methylene group (which forms a ring with $A_1$), or an ethylene group (which forms a ring with $A_1$).

Examples of the divalent linking group represented by $X_1$ include —COO—, —CONR₁₄- (where $R_{14}$ represents a hydrogen atom or an alkyl group), an alkylene group, and a group formed by combining two or more of these groups. Here, examples of the alkyl group of $R^{14}$ include the same alkyl groups as $R_{11}$ to $R_{13}$.

$X_1$ is preferably a single bond, —COO—, or —CONH—, more preferably a single bond or —COO—, and still more preferably a single bond.

$A_1$ represents a keto group or an (n1+1)-valent aromatic ring group and is preferably an (n1+1)-valent aromatic ring group.

The divalent aromatic ring group in the case where n1 is 1 may have a substituent, and is preferably, for example, an arylene group having 6 to 18 carbon atoms such as a phenylene group, a tolylene group, or a naphthylene group, or a divalent aromatic ring group containing a hetero ring such as thiophene, furan, pyrrole, benzothiophene, benzofuran, benzopyrrole, triazine, imidazole, benzimidazole, triazole, thiadiazole, or thiazole.

Specific examples of the (n1+1)-valent aromatic ring group in the case where n1 is an integer of 2 or more is preferably a group obtained by removing an (n1−1) number of arbitrary hydrogen atoms from the above-mentioned specific examples of the divalent aromatic ring group.

The (n1+1)-valent aromatic ring group may further have a substituent.

Examples of the substituent that the above-mentioned (n1+1)-valent aromatic ring group may have include the same specific examples as the substituents that each of the groups represented by $R_{11}$ to $R_{13}$ may have.

In the case where $A_1$ is an (n1+1)-valent aromatic ring group, n1 is preferably 1 or 2 and more preferably 1.

The alkyl group represented by Ra and Rb is, for example, an alkyl group having 1 to 8 carbon atoms, and specifically it is preferably a methyl group, an ethyl group, a propyl group, an n-butyl group, a sec-butyl group, a t-butyl group, a hexyl group, or an octyl group.

The cycloalkyl group represented by Ra and Rb is, for example, a cycloalkyl group having 3 to 15 carbon atoms, and specifically it is preferably a cyclopentyl group, a cyclohexyl group, a norbornyl group, or an adamantyl group.

The aryl group represented by Ra and Rb is, for example, an aryl group having 6 to 15 carbon atoms, and specifically it is preferably a phenyl group, a tolyl group, a naphthyl group, or an anthryl group.

The aralkyl group represented by Ra and Rb is preferably an aralkyl group having 6 to 20 carbon atoms and more preferably an aralkyl group having 7 to 12 carbon atoms. Specific examples of the aralkyl group of Ra and Rb include a benzyl group, a phenethyl group, a naphthylmethyl group, and a naphthylethyl group.

The heterocyclic group represented by Ra and Rb is preferably a heterocyclic group having 6 to 20 carbon atoms and more preferably a heterocyclic group having 6 to 12 carbon atoms. Specific examples of the heterocyclic group of Ra and Rb include a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

Examples of the divalent linking group represented by M include an alkylene group (for example, a methylene group, an ethylene group, a propylene group, a butylene group, a hexylene group, or an octylene group), a cycloalkylene group (for example, a cyclopentylene group, a cyclohexylene group, or an adamantylene group), an alkenylene group (for example, an ethenylene group, a propenylene group, or a butenylene group), a divalent aromatic ring group (for example, a phenylene group, a tolylene group, or a naphthylene group), —S—, —O—, —CO—, —SO$_2$—, —N(R$_0$)—, and a divalent linking group formed by combining a plurality of these groups. R$_0$ represents a hydrogen atom or an alkyl group (for example, an alkyl group having 1 to 8 carbon atoms, specifically a methyl group, an ethyl group, a propyl group, an n-butyl group, a sec-butyl group, a hexyl group, or an octyl group).

Specific examples and preferred examples of the alkyl group represented by Q are the same as those described for the alkyl group represented by Rb, for example.

The cycloalkyl group represented by Q may be monocyclic or polycyclic. The cycloalkyl group preferably has 3 to 10 carbon atoms. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, a 8-tricyclo[5.2.1.0$^{2,6}$]decyl group, and a 2-bicyclo[2.2.1]heptyl group. Among them, a cyclopentyl group, a cyclohexyl group, a 2-adamantyl group, a 8-tricyclo[5.2.1.0$^{2,6}$]decyl group, or 2-bicyclo[2.2.1] heptyl group is preferred.

Specific examples and preferred examples of the aryl group represented by Q are the same as those described for the aryl group represented by Ra, for example.

Specific examples and preferred examples of the heterocyclic group represented by Q are the same as those described for the heterocyclic group represented by Ra, for example.

The alkyl group, cycloalkyl group, aryl group, and heterocyclic group represented by Q may have a substituent, and specific examples similar to the substituents that each of the groups represented by R$_{11}$ to R$_{13}$ may have can be mentioned.

At least two of Q, M, and Ra may be bonded to each other to form a ring (preferably a 5- or 6-membered ring).

The ring which may be formed by bonding at least two of Q, M, and Ra to each other may be, for example, a case of forming a 5- or 6-membered ring in which at least two of Q, M, and Ra are bonded to form, for example, a propylene group or a butylene group, and the ring contains an oxygen atom.

Each of the groups represented by Ra, Rb, M, and Q in General Formula (1) may have a substituent and specific examples similar to the substituents that each of the groups represented by R$_{11}$ to R$_{13}$ may have can be mentioned, in which the substituent preferably has 8 or less carbon atoms.

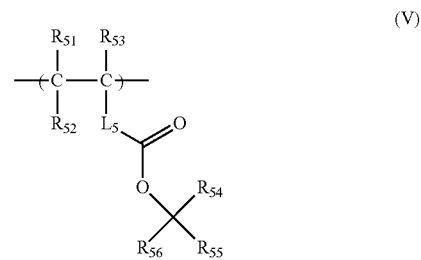

(V)

In General Formula (V),

R$_{51}$, R$_{52}$, and R$_{53}$ each independently represent a hydrogen atom, an alkyl group, a cycloalkyl group, a halogen atom, a cyano group, or an alkoxycarbonyl group. R$_{52}$ may be bonded to L$_5$ to form a ring, and R$_{52}$ in this case represents an alkylene group.

L$_5$ represents a single bond or a divalent linking group, and in the case of forming a ring with R$_{52}$, L$_5$ represents a trivalent linking group.

R$_{54}$ represents an alkyl group or a cycloalkyl group, and R$_{55}$ and R$_{56}$ each independently represent a hydrogen atom, an alkyl group, a cycloalkyl group, an aryl group, or an aralkyl group. R$_{55}$ and R$_{56}$ may be bonded to each other to form a ring. Provided that R$_{55}$ and R$_{56}$ are not a hydrogen atom at the same time.

General Formula (V) will be described in more detail.

Specific examples and preferred examples of the alkyl group, alkoxycarbonyl group, cycloalkyl group, and halogen atom of R$_{51}$ to R$_{53}$ in General Formula (V) are the same as the specific examples and preferred examples of the alkyl group, alkoxycarbonyl group, cycloalkyl group, and halogen atom of R$_{11}$ to R$_{13}$ in General Formula (1).

Examples of the divalent linking group represented by L$_5$ include an alkylene group, a divalent aromatic ring group, —COO-L$_1$-, —O-L$_1$-, and a group formed by combining two or more thereof. Here, L$_1$ represents an alkylene group, a cycloalkylene group, a divalent aromatic ring group, or a group formed by combining an alkylene group and a divalent aromatic ring group.

L$_5$ is preferably a single bond, a group represented by —COO-L$_1$-, or a divalent aromatic ring group. L$_1$ is preferably an alkylene group having 1 to 5 carbon atoms and more preferably a methylene group or a propylene group. The divalent aromatic ring group is preferably a 1,4-phenylene group, a 1,3-phenylene group, a 1,2-phenylene group, or a 1,4-naphthylene group and more preferably a 1,4-phenylene group.

As the trivalent linking group represented by L$_5$ in the case where L$_5$ is bonded to R$_{52}$ to form a ring, preferred is a group formed by removing one arbitrary hydrogen atom from the above-mentioned specific examples of the divalent linking group represented by L$_5$.

The alkyl group of R$_{54}$ to R$_{56}$ preferably has 1 to 20 carbon atoms and more preferably 1 to 10 carbon atoms. Among them, more preferred is an alkyl group having 1 to 4 carbon atoms such as a methyl group, an ethyl group, an n-propyl group, an isopropyl group, an n-butyl group, an isobutyl group, or a t-butyl group.

The cycloalkyl group represented by $R_{54}$ to $R_{56}$ preferably has 3 to 20 carbon atoms and may be a monocyclic group such as a cyclopentyl group or may be a cyclohexyl group, or a polycyclic group such as a norbornyl group, an adamantyl group, a tetracyclodecanyl group, or a tetracyclododecanyl group.

The ring formed by bonding $R_{55}$ and $R_{56}$ to each other is preferably a ring having 3 to 20 carbon atoms, which may be a monocyclic group such as a cyclopentyl group or a cyclohexyl group or may be a polycyclic group such as a norbornyl group, an adamantyl group, a tetracyclodecanyl group, or a tetracyclododecanyl group. In the case where $R_{55}$ and $R_{56}$ are bonded to each other to form a ring, $R_{54}$ is preferably an alkyl group having 1 to 3 carbon atoms and more preferably a methyl group or an ethyl group.

The aryl group represented by $R_{55}$ and $R_{56}$ is preferably an aryl group having 6 to 20 carbon atoms, which may be monocyclic or polycyclic and may have a substituent. Examples of the aryl group include a phenyl group, a 1-naphthyl group, a 2-naphthyl group, a 4-methylphenyl group, and a 4-methoxyphenyl group. In the case where one of $R_{55}$ and $R_{56}$ is a hydrogen atom, the other is preferably an aryl group.

The aralkyl group represented by $R_{55}$ and $R_{56}$ may be monocyclic or polycyclic and may have a substituent. The aralkyl group preferably has 7 to 21 carbon atoms, and specific examples of the aralkyl group include a benzyl group and a 1-naphthylmethyl group.

In the third resin, structural units having an acid-decomposable group may be used alone or in combination of two or more thereof.

The content of the structural unit having an acid-decomposable group contained in the third resin is preferably 5 to 70 mol %, more preferably 5 to 60 mol %, and still more preferably 10 to 50 mol % with respect to the total structural units in the third resin.

The third resin preferably contains a structural unit represented by General Formula (3).

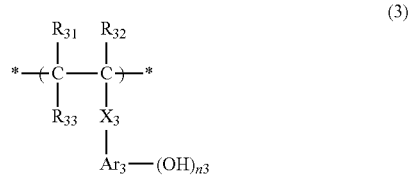

In General Formula (3), $R_{31}$, $R_{32}$, and $R_{33}$ each independently represent a hydrogen atom, an alkyl group, a cycloalkyl group, a halogen atom, a cyano group, or an alkoxycarbonyl group. $R_{33}$ may be bonded to $Ar_3$ to form a ring, and $R_{33}$ in this case represents an alkylene group.

$X_3$ represents a single bond or a divalent linking group.

$Ar_3$ represents an (n3+1)-valent aromatic ring group, and in the case of being bonded to $R_{33}$ to form a ring, $Ar_3$ represents an (n3+2)-valent aromatic ring group.

n3 represents an integer of 1 to 4.

Specific examples of the alkyl group, cycloalkyl group, halogen atom, and alkoxycarbonyl group of $R_{31}$, $R_{32}$, and $R_{33}$ in General Formula (3) and the substituent that such groups may have are the same as the specific examples described for each of the groups represented by $R_{11}$, $R_{12}$, and $R_{13}$ in General Formula (1).

$Ar_3$ represents an (n3+1)-valent aromatic ring group. The divalent aromatic ring group in the case where n3 is 1 may have a substituent, and is preferably an arylene group having 6 to 18 carbon atoms such as a phenylene group, a tolylene group, a naphthylene group, an aralkyl group, or an anthracenylene group, or an aromatic ring group containing a hetero ring such as thiophene, furan, pyrrole, benzothiophene, benzofuran, benzopyrrole, triazine, imidazole, benzimidazole, triazole, thiadiazole, aralkyl group, thiazole, and the like.

Specific preferred examples of the (n3+1)-valent aromatic ring group in the case where n3 is an integer of 2 or more include groups in which an (n3-1) number of arbitrary hydrogen atoms are removed from the above-mentioned specific examples of the divalent aromatic ring group.

The (n3+1)-valent aromatic ring group may further have a substituent.

Examples of the substituent that the above-mentioned alkylene group and (n3+1)-valent aromatic ring group may have include an alkyl group, an alkoxy group such as a methoxy group, an ethoxy group, a hydroxyethoxy group, a propoxy group, a hydroxypropoxy group, or a butoxy group, and an aryl group such as a phenyl group, which have been mentioned for $R_{51}$ to $R_{53}$ in General Formula (V).

Examples of the divalent linking group of $X_3$ include —COO— and —CONR$_{64}$—.

Examples of the alkyl group of $R_{64}$ in —CONR$_{64}$— (where $R_{64}$ represents a hydrogen atom or an alkyl group) represented by $X_3$ include the same alkyl groups as those of $R_{61}$ to $R_{63}$.

$X_3$ is preferably a single bond, —COO—, or —CONH— and more preferably a single bond or —COO—.

$Ar_3$ is preferably an aromatic ring group having 6 to 18 carbon atoms which may have a substituent, and more preferably a benzene ring group, a naphthalene ring group, or a biphenylene ring group.

It is preferred that the above-mentioned structural unit has a hydroxystyrene structure. That is, $Ar_3$ is preferably a benzene ring group.

n3 represents an integer of 1 to 4 and is preferably 1 or 2 and more preferably 1.

The content of the structural unit represented by General Formula (3) (the total content of the structural units in the case of containing a plurality of the structural units) is preferably 3 to 95 mol %, more preferably 10 to 80 mol %, and still more preferably 25 to 70 mol % with respect to the total structural units in the third resin.

The third resin may contain structural units other than the above-mentioned structural unit.

The content of the third resin in the composition is not particularly limited, but it is preferably 2 to 60 mass % and more preferably 10 to 50 mass % with respect to the total solid content of the composition, from the viewpoint that the effects of the present invention are excellent.

<Organic Amino Compound>

The composition of the present invention may further contain an organic amino compound. The organic amino compound functions as a so-called quencher which prevents diffusion of an acid.

The organic amino compound is preferably an aliphatic amine or phenyl group-containing amine having one or more amino groups in the molecule, and is more preferably a phenyl group-containing amine.

The aliphatic amine may be referred to, for example, the description in paragraphs [0120] to [0123] of JP2010-49161A, the contents of which are incorporated herein by reference in its entirety.

The phenyl group-containing amine may be, for example, a compound having an amino group directly bonded to a phenyl group, or a compound having an amino group bonded to a phenyl group through a divalent carbon chain.

Examples of the phenyl group-containing amine include:

aromatic amines such as aniline, o-methylaniline, m-methylaniline, p-methylaniline, p-ethylaniline, 1-naphthylamine, 2-naphthylamine, N,N-dimethylaniline, N,N-diethylaniline, N,N-dibutylaniline, and p-methyl-N,N-dimethylaniline;

aminobenzyl alcohols such as o-aminobenzyl alcohol, m-aminobenzyl alcohol, p-aminobenzyl alcohol, p-dimethylaminobenzyl alcohol, and p-diethylaminobenzyl alcohol;

aminophenols such as o-aminophenol, m-aminophenol, p-aminophenol, p-dimethylaminophenol, and p-diethylaminophenol; and aminobenzoic acids such as m-aminobenzoic acid, p-aminobenzoic acid, p-dimethylaminobenzoic acid, and p-diethylaminobenzoic acid.

The organic amino compound may be used alone or in combination of two or more thereof.

The content of the organic amino compound in the composition is not particularly limited, but it is preferably 0.001 to 1 mass % and more preferably 0.005 to 0.5 mass % with respect to the total solid content of the composition, from the viewpoint that the effects of the present invention are excellent.

<Silane Coupling Agent>

The composition of the present invention may further contain a silane coupling agent.

The silane coupling agent is a compound having a hydrolyzable group and other functional groups in the molecule. Note that a hydrolyzable group such as an alkoxy group is bonded to a silicon atom.

The hydrolyzable group refers to a substituent which is directly bonded to a silicon atom and is capable of generating a siloxane bond by a hydrolysis reaction and/or a condensation reaction. Examples of the hydrolyzable group include a halogen atom, an alkoxy group, an acyloxy group, and an alkenyloxy group. In the case where the hydrolyzable group has a carbon atom, the number of carbon atoms in such a group is preferably 6 or less and more preferably 4 or less. In particular, an alkoxy group having 4 or less carbon atoms or an alkenyloxy group having 4 or less carbon atoms is preferable.

The silane coupling agent preferably has a group represented by General Formula (Z). * represents the binding position.

  General Formula (Z)

In General Formula (Z), $R_{Z1}$ represents a hydrolyzable group, and the definition thereof is as described above.

$R_{Z2}$ represents an organic group other than a hydrolyzable group and is preferably an alkyl group.

n represents an integer of 1 to 3 and is preferably 2 or 3 and more preferably 3.

The silane coupling agent may have a curable functional group.

The curable functional group is preferably one or more selected from the group consisting of a (meth)acryloyloxy group, an epoxy group, an oxetanyl group, an isocyanate group, a hydroxyl group, an amino group, a carboxylic acid group, a thiol group, an alkoxysilyl group, a methylol group, a vinyl group, a (meth)acrylamide group, a styryl group, and a maleimide group. From the viewpoint that the effects of the present invention are excellent, it is preferred that the curable functional group is one or more selected from the group consisting of a (meth)acryloyloxy group, an epoxy group, and an oxetanyl group. The curable functional group may be directly bonded to a silicon atom or may be bonded to a silicon atom through a linking group.

The molecular weight of the silane coupling agent is not particularly limited and it is often 100 to 1000 from the viewpoint of handleability and is preferably 200 or more and more preferably 200 to 1000 from the viewpoint that the effects of the present invention are excellent.

One suitable aspect of the silane coupling agent is, for example, a silane coupling agent X represented by General Formula (W).

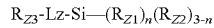  General Formula (W)

The definitions of $R_{z1}$, $R_{z2}$, and n are as described above.

$R_{z3}$ represents a curable functional group, in which the definition thereof is as described above, and the suitable range thereof is also as described above.

Lz represents a single bond or a divalent linking group. Examples of the divalent linking group include an alkylene group which may be substituted by a halogen atom, an arylene group which may be substituted by a halogen atom, —$NR^{12}$—, —$CONR^{12}$—, —CO—, —$CO_2$—, $SO_2NR^{12}$—, —O—, —S—, —$SO_2$—, and a combination thereof. $R^{12}$ represents a hydrogen atom or a methyl group.

Examples of the silane coupling agent X include N-β-aminoethyl-γ-aminopropyl-methyldimethoxysilane (trade name: KBM-602, manufactured by Shin-Etsu Chemical Co., Ltd.), N-β-aminoethyl-γ-aminopropyl-trimethoxysilane (trade name: KBM-603, manufactured by Shin-Etsu Chemical Co., Ltd.), N-β-aminoethyl-γ-aminopropyl-triethoxysilane (trade name: KBE-602, manufactured by Shin-Etsu Chemical Co., Ltd.), γ-aminopropyl-trimethoxysilane (trade name: KBM-903, manufactured by Shin-Etsu Chemical Co., Ltd.), γ-aminopropyl-triethoxysilane (trade name: KBE-903, manufactured by Shin-Etsu Chemical Co., Ltd.), 3-methacryloxypropyltrimethoxysilane (trade name: KBM-503, manufactured by Shin-Etsu Chemical Co., Ltd.), glycidoxyoctyltrimethoxysilane (trade name: KBM-4803, manufactured by Shin-Etsu Chemical Co., Ltd.), 2-(3,4-epoxycyclohexyl)ethyltrimethoxysilane (trade name: KBM-303, manufactured by Shin-Etsu Chemical Co., Ltd.), 3-glycidoxypropylmethyldimethoxysilane (trade name: KBM-402 manufactured by Shin-Etsu Chemical Co., Ltd.), and 3-glycidoxypropyltrimethoxysilane (trade name: KBM-403, manufactured by Shin-Etsu Chemical Co., Ltd.).

The content of the silane coupling agent in the composition is not particularly limited, but it is preferably 0.1 to 10 mass % and more preferably 0.5 to 8 mass %, with respect to the total solid content of the composition, from the viewpoint that the effects of the present invention are excellent.

<Surfactant>

The composition of the present invention may contain a variety of surfactants, from the viewpoint of further improving coatability. The surfactant includes a variety of surfactants such as a fluorine-based surfactant, a nonionic surfactant, a cationic surfactant, an anionic surfactant, and a silicone-based surfactant.

In particular, incorporation of a fluorine-based surfactant in the composition of the present invention leads to further improved liquid characteristics (in particular, fluidity) in the case where the composition is prepared in the form of a coating liquid, which can therefore further improve uniformity in the thickness of coating and effect of liquid saving.

That is, in the case of forming a film by using a coating liquid to which a composition containing a fluorine-based surfactant is applied, by reducing the interfacial tension between the surface to be coated and the coating liquid, wettability to the surface to be coated is improved, and the coatability onto the surface to be coated is improved. Therefore, even in the case where a thin film having a thickness of about several micrometers is formed with a small amount of liquid, uniform thickness film formation with less thickness unevenness can be carried out more suitably.

The fluorine content in the fluorine-based surfactant is preferably 3 to 40 mass %, more preferably 5 to 30 mass %, and still more preferably 7 to 25 mass %. The fluorine-based surfactant having a fluorine content within this range is effective from the viewpoint of the coating film thickness uniformity or liquid saving, and exhibits good solubility in the composition.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781, MEGAFACE F-781-F, MEGAFACE RS-55, RS-56, and MEGAFACE RS-72-K, RS-75 (all manufactured by DIC Corporation); FLUORAD FC430, FLUORAD FC431, and FLUORAD FC171 (all manufactured by Sumitomo 3M, Ltd.); and SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (all manufactured by Asahi Glass Co., Ltd.).

Examples of the nonionic surfactant include the nonionic surfactants described, for example, in paragraph [0553] of JP2012-208494A (paragraph [0679] of correspondent US2012/0235099A), the contents of which are incorporated herein by reference in its entirety.

Examples of the cationic surfactant include the cationic surfactants described in paragraph [0554] of JP2012-208494A (paragraph [0680] of correspondent US2012/0235099A), the contents of which are incorporated herein by reference in its entirety.

Examples of the anionic surfactant include W004, W005, and W017 (manufactured by Yusho Co., Ltd.).

Examples of the silicone-based surfactant include the silicone-based surfactants described, for example, in paragraph [0556] of JP2012-208494A (paragraph [0682] of correspondent US2012/0235099A), the contents of which are incorporated herein by reference in its entirety.

The surfactants may be used alone or in combination of two or more thereof.

The content of the surfactant in the composition is not particularly limited, but it is preferably 0.001 mass % or more, more preferably 0.005 mass % or more and still more preferably 0.5 mass % or more and preferably 15 mass % or less, more preferably 10 mass % or less, still more preferably 7 mass % or less and particularly preferably 5 mass % or less with respect to the total solid content of the composition, from the viewpoint that the effects of the present invention are excellent.

<Solvent>

The composition of the present invention may further contain a solvent.

The solvent may be, for example, a liquid selected from organic solvents shown below. An optimum solvent is selected depending on the components to be used.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl oxyacetates (for example, methyl oxyacetate, ethyl oxyacetate, and butyl oxyacetate (for example, methyl methoxyacetate, ethyl methoxyacetate, butyl methoxyacetate, methyl ethoxyacetate, or ethyl ethoxyacetate)), alkyl 3-oxypropionates (for example, methyl 3-oxypropionate and ethyl 3-oxypropionate (for example, methyl 3-methoxypropionate, ethyl 3-methoxypropionate, methyl 3-ethoxypropionate, or ethyl 3-ethoxypropionate)), alkyl 2-oxypropionates (for example, methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate and ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol dibutyl ether, propylene glycol monomethyl ether, propylene glycol monomethyl ether acetate (PGMEA), propylene glycol monoethyl ether acetate, and propylene glycol propyl ether acetate; ketones such as methyl ethyl ketone, cyclohexanone, cyclopentanone, 2-heptanone, and 3-heptanone; and aromatic hydrocarbons such as toluene and xylene.

From the viewpoint of improving the solubility of a polymerizable compound, an alkali-soluble resin, or the like and improving the coated surface state, it is also preferable to mix two or more of these organic solvents. In this case, preferred is a mixed solution made of two or more selected from the above-mentioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, it is preferred that the content of a peroxide in the organic solvent is 0.8 mmol/L or less and it is more preferred that the organic solvent is substantially free from a peroxide.

The content of the solvent in the composition is not particularly limited, but it is preferably 20 to 90 mass %, more preferably 30 to 95 mass %, and most preferably 40 to 90 mass % with respect to the total mass of the composition.

In addition to the above-mentioned components, a resin used for dispersing a pigment may be further added, if necessary. Note that the resin may be a resin different from the first resin to the third resin.

Examples of the resin different from the first resin to the third resin include ACRYBASE FFS-6824 and ACRYCURE RD-F8. These resins may be used, for example, as a dispersant for a coloring agent.

(Other Additives)

The composition of the present invention may contain other additives, if necessary, within a range that does not impair the effects of the present invention. Examples of the other additives include, but are not limited to, known additives such as an anti-drying agent (wetting agent), a discoloration preventer, an emulsion stabilizer, a penetration enhancer, an ultraviolet absorber, a preservative, an antibacterial agent, a pH adjusting agent, a surface tension adjuster, an antifoaming agent, a viscosity adjuster, a dispersion stabilizer, a rust inhibitor, a chelating agent, an antioxidant, an adhesion aid, a surfactant, a resin coating agent, an extender pigment, and a pigment derivative.

<Coloring Photosensitive Composition>

The coloring photosensitive composition includes the above-mentioned various components.

The composition of the present invention satisfies at least one of the following requirements 1 or 2.

Requirement 1: The first resin is a resin whose solubility in an alkaline developer is improved by the action of an acid.

Requirement 2: The coloring photosensitive composition further includes a third resin whose solubility in an alkaline developer is improved by the action of an acid.

In the case where the composition satisfies at least one of the requirements 1 or 2, it is possible to suitably carry out the pattern development to be described later. It is preferred that the composition satisfies both of the requirements 1 and 2 from the viewpoint that the effects of the present invention are excellent.

The requirement 1 is intended to mean that the first resin itself is a resin which contains a structural unit having a cyclic ether group and whose solubility in an alkaline developer is improved by the action of an acid. As described above, in the case where the first resin contains a structural unit represented by General Formula (X2), it corresponds to a resin whose solubility in an alkaline developer is improved by the action of an acid. In addition, the first resin may contain a structural unit having an acid-decomposable group which may be contained in the above-mentioned third resin.

The method for preparing a coloring photosensitive composition is not particularly limited, and the composition can be prepared by a known method. In particular, in the case where a pigment is used as the coloring agent, from the viewpoint that the effects of the present invention are excellent, preferred is a method in which a pigment dispersion liquid is first prepared, and then the pigment dispersion liquid and other components are mixed to thereby prepare a coloring photosensitive composition. In the case of preparing a pigment dispersion liquid, it is preferable to prepare the pigment dispersion liquid using the pigment and the second resin. In this case, the second resin functions as a dispersant for the pigment.

The method for preparing the pigment dispersion liquid is not particularly limited, but there is, for example, a method in which the second resin, the pigment, and the solvent are subjected to a fine dispersion treatment in a vertical or horizontal-type sand grinder, a pin mill, a slit mill, an ultrasonic dispersing machine, or the like, using 0.01 to 1-mm beads made of glass, zirconia, or the like.

Prior to the dispersion of beads, a kneading and dispersion treatment can also be carried out while applying a strong shearing force using a double roll mill, three-roll mill, ball mill, trommel, disperser, kneader, co-kneader, homogenizer, blender, single-screw or double-screw extruder, or the like.

The time for the kneading and dispersion treatment is not particularly limited, but it is preferably, for example, 2 hours or longer.

The details of kneading and dispersion may be referred to, for example, the description in T. C. Patton, "Paint Flow and Pigment Dispersion", 1964, published by John Wiley and Sons.

The ratio of the pigment in the pigment dispersion liquid is preferably 20 mass % or more, more preferably 40 mass % or more, still more preferably 60 mass % or more, and particularly preferably 75 mass % or more with respect to the total solid content (mass) of the composition. In the case where the ratio of the pigment is within the above-specified range, the color density is sufficient and therefore excellent color characteristics can be secured. The upper limit of the content of the pigment in the pigment dispersion liquid is not particularly limited, but it is preferably 95 mass % or less and more preferably 80 mass % or less.

The composition of the present invention can be prepared by mixing the above-mentioned various components using a known mixing method (for example, a stirrer, a homogenizer, a high pressure emulsification apparatus, a wet type pulverizer, or a wet type dispersing machine).

The composition of the present invention is preferably filtered with a filter for the purpose of removing foreign matters or reducing defects. Any filter may be used without particular limitation as long as it is conventionally used for filtration or the like. For example, the filter may be a filter made of a fluororesin such as polytetrafluoroethylene (PTFE), a polyamide-based resin such as nylon, a polyolefin resin such as polyethylene or polypropylene (PP) (including ones having a high density and an ultra-high molecular weight), or the like. Among these materials, preferred is polypropylene (including high-density polypropylene) or nylon.

The pore size of the filter is suitably about 0.1 to 7.0 µm, preferably 0.2 to 2.5 µm, more preferably 0.2 to 1.5 µm, and still more preferably 0.3 to 0.7 µm. By specifying the pore size of the filter to be in this range, it becomes possible to reliably remove fine foreign materials such as impurities and aggregates contained in the pigment, while suppressing filtration clogging of the pigment.

In the use of a filter, different filters may be used in combination. In that case, filtering by a first filter may be carried out only once or two or more times. In a case of filtering two or more times by combining different filters, the pore size for a second or subsequent filtering is preferably made larger than or equal to that for a first filtering. In addition, first filters having a different pore size in the above-mentioned range may be used in combination. The pore size herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation.

As the second filter, a filter made of the same material or the like as the above-mentioned first filter can be used. The pore size of the second filter is suitably about 0.2 to 10.0 µm, preferably 0.2 to 7.0 µm, and more preferably 0.3 to 6.0 µm.

<Resin Film Production Method>

The resin film production method is not particularly limited, but from the viewpoint of easy production of a resin film, preferred is a production method including a colored layer forming step of applying the above-mentioned coloring photosensitive composition onto a support to form a colored layer, an exposure step of exposing the colored layer patternwise through a mask, and a development step of developing the colored layer after exposure to form a patterned resin film.

Hereinafter, individual steps in the resin film production method of the present invention will be described.

(Colored Layer Forming Step)

In the colored layer forming step, the composition of the present invention is applied onto a support to form a colored layer (colored photosensitive composition layer).

Examples of the support include alkali-free glass, soda glass, PYREX (registered trademark) glass and quartz glass, which are used in a liquid crystal display device or the like, and those having a transparent electroconductive film adhered thereto, and a photoelectric conversion element substrate (such as a silicon substrate) and a complementary metal oxide semiconductor (CMOS), which are used in a solid-state imaging element or the like. There are some cases where black stripes for separating pixels are formed on the substrate.

Depending on the necessity, an undercoat layer may be provided on the support for improvement of adhesion to the upper layer, prevention of diffusion of substances, or planarization of the surface of the substrate.

Examples of the method of applying the composition of the present invention onto a support include various coating methods such as slit coating, an inkjet method, spin coating, cast coating, roll coating, and screen printing, among which slit coating and spin coating are more preferred.

The film thickness immediately after application of the composition is preferably 0.1 to 10 µm, more preferably 0.2 to 5 µm, and still more preferably 0.2 to 3 µm, from the viewpoint of film thickness uniformity of the coating film and ease of drying of the coating solvent.

Drying (pre-baking) of the colored layer applied on the substrate can be carried out at a temperature of 50° C. to 140° C. for 10 to 300 seconds in a hot plate, an oven, or the like.

The thickness of the colored layer applied on the substrate, that is, the coating film thickness after drying of the coloring photosensitive composition (hereinafter, referred to as a "dry film thickness" as appropriate) is not particularly limited, but it is usually preferably 0.05 to 10 µm and more preferably 0.2 to 3.0 µm.

<Exposure Step>

In the exposure step, the colored layer formed in the colored layer forming step is exposed through a mask having a predetermined mask pattern.

In the exposure in this step, patternwise exposure of the colored layer is carried out through a predetermined mask pattern, an acid component is generated from the photoacid generator in the colored layer portion irradiated with light, and therefore the decomposition of an acid-decomposable group of the resin occurs. As a result, the solubility of the colored layer changes only in the exposed portion.

As the radiation that can be used for exposure, ultraviolet rays such as g line, h line, and i line are particularly preferable. The irradiation dose is preferably 5 to 1,500 mJ/cm$^2$, more preferably 10 to 1,000 mJ/cm$^2$, and still more preferably 50 to 500 mJ/cm$^2$.

After the exposure step, a heat treatment (Post Exposure Bake (PEB)) may be carried out if necessary.

The heating temperature is preferably 70° C. to 130° C. and more preferably 80° C. to 120° C. The heating time is preferably 30 to 300 seconds, more preferably 30 to 180 seconds, and still more preferably 30 to 90 seconds.

The heating can be carried out by means provided in a conventional exposure/development machine and it may be carried out using a hot plate or the like. The reaction at the exposed portion is accelerated by baking, and therefore sensitivity and pattern profile are improved.

<Development Step>

Then, a development treatment (development step) is carried out to thereby form a patterned resin film.

The development step may be a development step using a developer containing an organic solvent or a development step using an alkaline developer. In addition, both of these steps may be included, and in that case, the order of steps is not particularly limited.

In the pattern forming method of the present invention, the developer usable in the step of developing the film by using an organic solvent-containing developer (hereinafter, also referred to as an "organic developer") may be, for example, a polar solvent such as a ketone-based solvent, an ester-based solvent, an alcohol-based solvent, an amide-based solvent, or an ether-based solvent, or a hydrocarbon-based solvent. Specific examples of these solvents include the developers described in paragraphs [0633] to [0641] of US2008/0187860A.

In particular, the organic developer is preferably a developer containing at least one organic solvent selected from the group consisting of a ketone-based solvent and an ester-based solvent, particularly preferably a developer containing butyl acetate as the ester-based solvent and methyl amyl ketone (2-heptanone) as the ketone-based solvent.

A plurality of solvents may be mixed, or the solvent may be used in admixture with a solvent other than those described above or with water. However, in order to sufficiently exert the effects of the present invention, it is preferred that the moisture content percentage in the entire developer is less than 10 mass %, and it is more preferred that the developer contains substantially no moisture.

That is, the amount of the organic solvent used in the organic developer is preferably 90 to 100 mass % and more preferably 95 to 100 mass % with respect to the total amount of the developer.

The vapor pressure at 20° C. of the organic developer is preferably 5 kPa or less, more preferably 3 kPa or less, and still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

The organic developer may contain a surfactant, if desired.

The surfactant is not particularly limited, but examples thereof include ionic or nonionic fluorine-based and/or silicone-based surfactants. These fluorine-based and/or silicone-based surfactants include, for example, surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720A, 5,360,692A, 5,529,881A, 5,296,330A, 5,436,098A, 5,576,143A, 5,294,511A, and 5,824,451A. A nonionic surfactant is preferred. The nonionic surfactant is not particularly limited, but a fluorine-based surfactant or a silicone-based surfactant is more preferred.

The amount of the surfactant used is usually 0.001 to 5 mass %, preferably 0.005 to 2 mass %, and more preferably 0.01 to 0.5 mass % with respect to the total amount of the developer.

Examples of the alkaline agent used in the alkaline developer include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene; inorganic compounds such as sodium hydroxide, potassium hydroxide, sodium hydrogen carbonate, and potassium hydrogen carbonate; and the like. The developer is preferably an alkaline aqueous solution obtained by diluting such an alkaline agent with pure water so that the concentration of the alkaline agent is 0.001 to 10 mass % (preferably 0.01 to 1 mass %).

Further, depending on the purpose, a chelating agent, a pH adjusting agent, a pH buffering agent, a rust inhibitor, and an antibacterial agent may be used in combination.

From the viewpoint of achieving reproducibility of the exposure pattern and low reflection, alkaline development is preferable. By the alkaline development, the exposed portion is eluted in an alkaline aqueous solution, and an unexposed portion remains. A known method can be adopted as the developing method. For example, a method of dipping the substrate in a bath filled with the developer for a fixed time (dipping method), a method of raising the developer on the substrate surface by the effect of a surface tension and keeping it still for a fixed time, thereby performing development (puddling method), a method of spraying the developer on the substrate surface (spraying method), and a method of continuously ejecting the developer on the substrate spinning at a constant speed while scanning with a developer ejecting nozzle at a constant rate (dynamic dispense method) may be applied.

The development temperature is preferably 20° C. to 30° C., and the development time is preferably 20 to 90 seconds.

In the case where the above-mentioned various developing methods include a step of ejecting the developer toward the resist film from a development nozzle of a developing apparatus, the ejection pressure of the developer ejected (the flow rate per unit area of the developer ejected) is, for example, preferably 2 mL/sec/mm$^2$ or less, more preferably 1.5 mL/sec/mm$^2$ or less, and still more preferably 1 mL/sec/mm$^2$ or less. The lower limit of the flow rate is not particularly limited, but it is preferably 0.2 mL/sec/mm$^2$ or more in view of throughput. This is described in detail particularly in paragraphs [0022] to [0029] of JP2010-232550A, and the like.

In addition, the step of carrying out the development using a developer containing an organic solvent or an alkaline developer may be followed by a step of stopping the development while replacing the developer with another solvent.

In the case where such a developer made of an organic solvent and an alkaline aqueous solution is used, it is generally followed by washing (rinsing) with an organic solvent or pure water after development. An appropriate amount of a surfactant may be added to the rinsing liquid in the rinsing treatment.

As the rinsing liquid in the case where an organic solvent is used, it is preferable to use a rinsing liquid containing at least one organic solvent selected from the group consisting of a hydrocarbon-based solvent, a ketone-based solvent, an ester-based solvent, an alcohol-based solvent, an amide-based solvent, and an ether-based solvent.

Specific examples of a hydrocarbon-based solvent, a ketone-based solvent, an ester-based solvent, an alcohol-based solvent, an amide-based solvent, and an ether-based solvent are the same as those described for the developer containing an organic solvent.

The moisture content in the rinsing liquid is preferably 10 mass % or less, more preferably 5 mass % or less, and still more preferably 3 mass % or less. By setting the moisture content to 10 mass % or less, satisfactory development characteristics can be obtained. The vapor pressure at 20° C. of the rinsing liquid used after the step of carrying out the development using a developer containing an organic solvent is preferably 0.05 kPa or more and 5 kPa or less, more preferably 0.1 kPa or more and 5 kPa or less, and particularly preferably 0.12 kPa or more and 3 kPa or less. By setting the vapor pressure of the rinsing liquid to 0.05 kPa or more and 5 kPa or less, the temperature uniformity in the wafer plane is improved, further the swelling due to permeation of the rinsing liquid is suppressed, and therefore the dimensional uniformity in the wafer plane is improved.

As the rinsing liquid in the case where an alkaline developer is used, pure water can be used and an appropriate amount of a surfactant can be added and used therewith.

Further, a treatment of removing the developer or the rinsing liquid adhering onto the pattern with a supercritical fluid can be carried out after the development treatment or the rinsing treatment.

The organic developer, the alkaline developer and/or the rinsing liquid to be used is preferably low in impurities such as various fine particles and metal elements. In order to obtain a chemical liquid containing a small amount of such impurities, it is preferable to reduce impurities in such a manner that the chemical liquid is produced in a clean room and then subjected to filtration using various filters such as a Teflon (registered trademark) filter, a polyolefin-based filter, and an ion exchange filter.

As described above, in the development step, the colored layer in the exposed portion is removed, and one of the resins forming the phase separation structure on the surface of the colored layer in the unexposed portion is removed, and as a result, a resin film with a rough surface is obtained.

<Use>

The resin film of the present invention can be applied to various uses, for example, a color filter and a light shielding film. More specifically, in the case where a black pigment is used as a coloring agent, the resin film of the present invention can be used as a so-called light shielding film. In particular, since the resin film of the present invention exhibits a low reflectivity, it can be used as a light shielding film exhibiting a low reflectivity and therefore can be suitably applied to a resin black matrix, a solid-state imaging device, and an image display device.

As other uses of the resin film, it can be used for a human sensor, an in-vehicle sensor, and the like.

EXAMPLES

Hereinafter, the present invention will be described more specifically with reference to the Examples. The materials, amounts of use, ratios, treatment contents, treatment procedure, and the like shown in the following Examples can be appropriately changed without departing from the spirit of the present invention. Therefore, the scope of the present invention is not limited to the following specific Examples. Unless otherwise specified, "parts" and "%" are on a mass basis.

In the following Synthesis Examples, the following symbols respectively represent the following compounds.

MATHF: tetrahydrofuran-2-yl methacrylate (synthetic product)

MATHP: tetrahydro-2H-pyran-2-yl methacrylate (synthetic product: see the following structural formula)

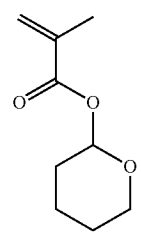

MAA: methacrylic acid (manufactured by Wako Pure Chemical Industries, Ltd.)
MMA: methyl methacrylate (manufactured by Wako Pure Chemical Industries, Ltd.)
St: styrene (manufactured by Wako Pure Chemical Industries, Ltd.)
HEMA: 2-hydroxyethyl methacrylate (manufactured by Wako Pure Chemical Industries, Ltd.)
PHSTHF: tetrahydrofuranyl ether of p-hydroxystyrene (synthetic product)
PHSEVE: 1-ethoxyethyl ether of p-hydroxystyrene (synthetic product)
PHS: p-hydroxystyrene (manufactured by Wako Pure Chemical Industries, Ltd.)
GMA: glycidyl methacrylate
BnMA: benzyl methacrylate
FA-513M: dicyclopentanyl methacrylate (manufactured by Hitachi Chemical Co., Ltd.)
V-65: 2,2'-azobis(2,4-dimethylvaleronitrile) (manufactured by Wako Pure Chemical Industries, Ltd.)
PGMEA: propylene glycol monomethyl ether acetate (methoxypropyl acetate, manufactured by Showa Denko KK)

Synthesis Example 1: Synthesis of MATHF 50.33 g (0.585 mol) of methacrylic acid and 0.27 g (0.2 mol) of camphorsulfonic acid were mixed in a three-neck flask and cooled to 15° C. 41.00 g (0.585 mol) of 2,3-dihydrofuran was added dropwise to the solution which was then stirred. After completion of the reaction, a saturated aqueous sodium hydrogen carbonate solution (500 mL) was added to the reaction solution which was then extracted with ethyl acetate (500 mL). Magnesium sulfate was added to the obtained ethyl acetate, followed by drying. The resulting solution was filtered, the filtrate was recovered, and the resulting filtrate was concentrated under reduced pressure at 40° C. or lower. The colorless oil of the resulting residue was distilled under reduced pressure to give 73.02 g of MATHF having a boiling point (bp.) of 54° C. to 56° C./3.5 mmHg fraction.

Synthesis Example 2: Synthesis of MATHP

MATHP was synthesized according to the same procedure as the synthesis of MATHF, except that 2,3-dihydrofuran was changed to 3,4-dihydro-2H-pyran (manufactured by Tokyo Chemical Industry Co., Ltd.).

Synthesis Example 3: Synthesis of PHSTHF

PHSTHF was synthesized according to the same procedure as the synthesis of MATHF, except that methacrylic acid was changed to 4-hydroxystyrene.

Synthesis Example 4: Synthesis of PHSEVE

PHSEVE was synthesized according to the same procedure as the synthesis of MATHF, except that 2,3-dihydrofuran was changed to ethyl vinyl ether and methacrylic acid was changed to 4-hydroxystyrene.

<Synthesis of Polymer P-1>
PGMEA was placed in a three-neck flask and the temperature was raised to 90° C. in a nitrogen atmosphere. A solution of 0.65 molar equivalent of MATHF, 0.10 molar equivalent of MAA, 0.15 molar equivalent of MMA, 0.10 molar equivalent of HEMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours to complete the reaction. Thereby, a polymer P-1 was obtained. The weight-average molecular weight of the polymer P-1 was 14,000.

Thereafter, a polymer solution (solvent: PGMEA) having a concentration of the polymer P-1 of 30 mass % was prepared.

<Synthesis of Polymer P-2>
PGMEA was placed in a three-neck flask and the temperature was raised to 90° C. in a nitrogen atmosphere. A solution of 0.70 molar equivalent of MATHF, 0.15 molar equivalent of MAA, 0.10 molar equivalent of MMA, 0.05 molar equivalent of St, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours to complete the reaction. Thereby, a polymer P-2 was obtained. The weight-average molecular weight of the polymer P-2 was 15,000.

Thereafter, a polymer solution (solvent: PGMEA) having a concentration of the polymer P-2 of 30 mass % was prepared.

<Synthesis of Polymer P-3>
PGMEA was placed in a three-neck flask and the temperature was raised to 90° C. in a nitrogen atmosphere. A solution of 0.60 molar equivalent of MATHP, 0.20 molar equivalent of MAA, 0.20 molar equivalent of MMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours to complete the reaction. Thereby, a polymer P-3 was obtained. The weight-average molecular weight of the polymer P-3 was 12,000.

Thereafter, a polymer solution (solvent: PGMEA) having a concentration of the polymer P-3 of 30 mass % was prepared.

<Synthesis of Polymer P-4>
PGMEA was placed in a three-neck flask and the temperature was raised to 90° C. in a nitrogen atmosphere. A solution of 0.70 molar equivalent of GMA, 0.10 molar equivalent of MAA, 0.20 molar equivalent of BnMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours to complete the reaction. Thereby, a polymer P-4 was obtained. The weight-average molecular weight of the polymer P-4 was 13,000.

Thereafter, a polymer solution (solvent: PGMEA) having a concentration of the polymer P-4 of 30 mass % was prepared.

<Synthesis of Polymer P-5>
PGMEA was placed in a three-neck flask and the temperature was raised to 90° C. in a nitrogen atmosphere. A solution of 0.40 molar equivalent of PHSTHF, 0.60 molar equivalent of PHS, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours, and the reaction was terminated to obtain a polymer P-5. The weight-average molecular weight of the polymer P-5 was 14,000.

Thereafter, a polymer solution (solvent: PGMEA) having a concentration of the polymer P-5 of 30 mass % was prepared.

<Synthesis of Polymer P-6>

PGMEA was placed in a three-neck flask and the temperature was raised to 90° C. in a nitrogen atmosphere. A solution of 0.40 molar equivalent of PHSEVE, 0.60 molar equivalent of PHS, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours, and the reaction was terminated to obtain a polymer P-6. The weight-average molecular weight of the polymer P-6 was 15,000.

Thereafter, a polymer solution (solvent: PGMEA) having a concentration of the polymer P-6 of 30 mass % was prepared.

<Synthesis of Polymer P-7>

Specific resin 2 described in the Example section of JP2011-153283A was used as polymer P-7.

Thereafter, a polymer solution (solvent: PGMEA) having a concentration of the polymer P-7 of 30 mass % was prepared.

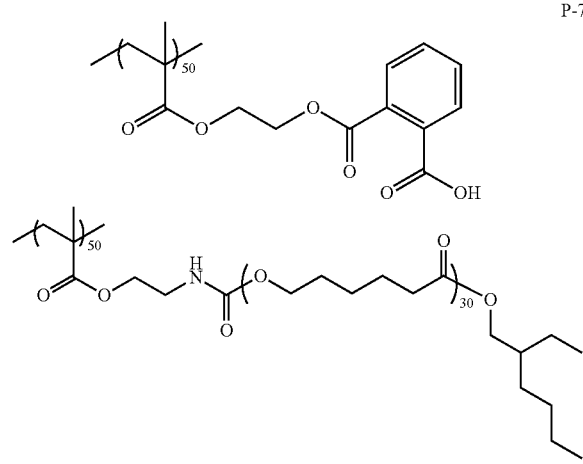

P-7

<Synthesis of Polymer P-8>

PGMEA was placed in a three-neck flask and the temperature was raised to 90° C. in a nitrogen atmosphere. A solution of 0.40 molar equivalent of n-octyl methacrylate (manufactured by Wako Pure Chemical Industries, Ltd.), 0.30 molar equivalent of MAA, 0.30 molar equivalent of BnMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours, and the reaction was terminated to obtain a polymer P-8. The weight-average molecular weight of the polymer P-8 was 16,000.

Thereafter, a polymer solution (solvent: PGMEA) having a concentration of the polymer P-8 of 30 mass % was prepared.

<Synthesis of Polymer P-9>

PGMEA was placed in a three-neck flask and the temperature was raised to 90° C. in a nitrogen atmosphere. A solution of 0.25 molar equivalent of cyclohexyl methacrylate (manufactured by Tokyo Chemical Industry Co., Ltd.), 0.30 molar equivalent of MAA, 0.45 molar equivalent of BnMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours, and the reaction was terminated to obtain a polymer P-9. The weight-average molecular weight of the polymer P-9 was 14,000.

Thereafter, a polymer solution (solvent: PGMEA) having a concentration of the polymer P-9 of 30 mass % was prepared.

<Synthesis of Polymer P-10>

PGMEA was placed in a three-neck flask and the temperature was raised to 90° C. in a nitrogen atmosphere. A solution of 0.20 molar equivalent of FA-513M, 0.30 molar equivalent of MAA, 0.50 molar equivalent of BnMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours, and the reaction was terminated to obtain a polymer P-10. The weight-average molecular weight of the polymer P-10 was 14,000.

Thereafter, a polymer solution (solvent: PGMEA) having a concentration of the polymer P-10 of 30% was prepared.

<Synthesis of Polymer P-11>

PGMEA was placed in a three-neck flask and the temperature was raised to 90° C. in a nitrogen atmosphere. A solution of 0.40 molar equivalent of tetrahydrofurfuryl methacrylate (manufactured by Tokyo Chemical Industry Co., Ltd.), 0.20 molar equivalent of MAA, 0.40 molar equivalent of MMA, and V-65 (corresponding to 4 mol % with respect to a total of 100 mol % of the total monomer components) dissolved in PGMEA was added dropwise thereto over 2 hours. After completion of the dropwise addition, the mixture was stirred for 2 hours to complete the reaction. Thereby, a polymer P-11 was obtained. The weight-average molecular weight of the polymer P-11 was 15,000.

Thereafter, a polymer solution (solvent: PGMEA) having a concentration of the polymer P-11 of 30 mass % was prepared.

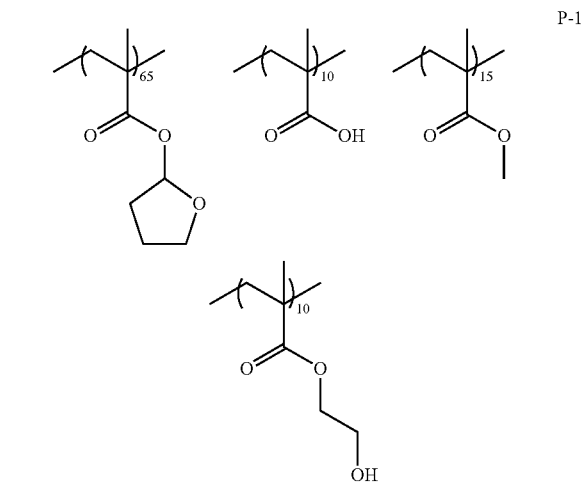

P-1

P-2
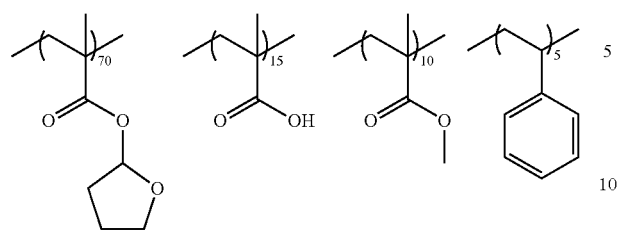
P-3
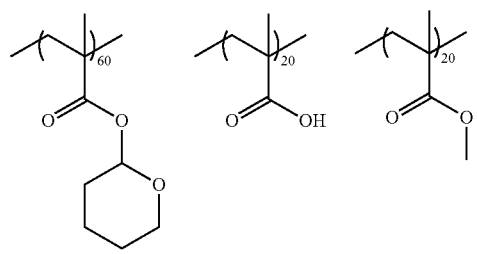
P-4
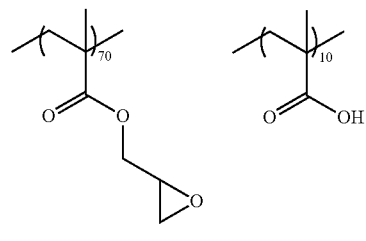
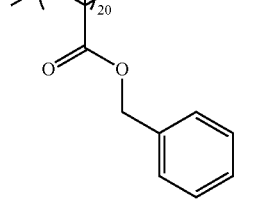
P-5
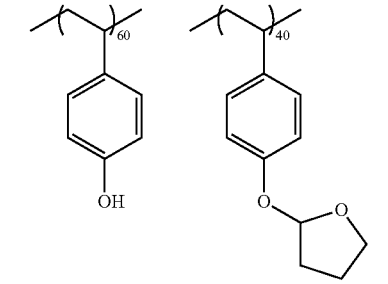
P-6
P-7
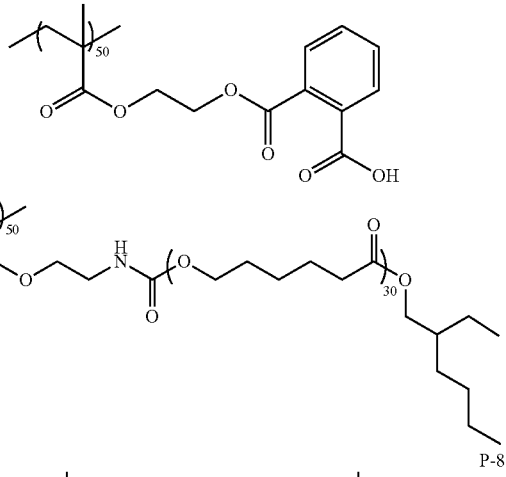
P-8
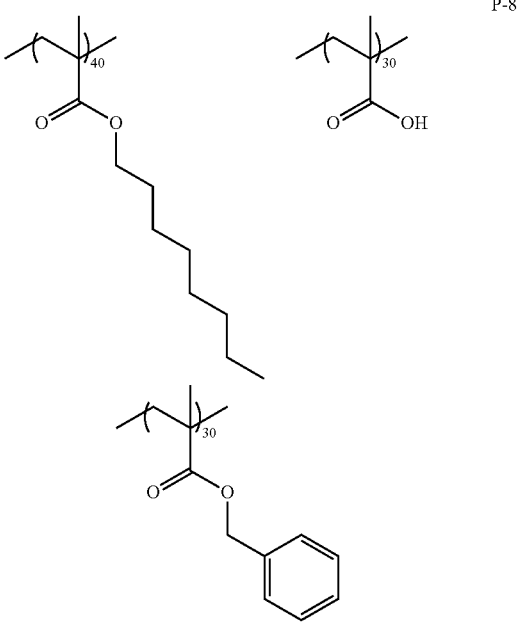
P-9
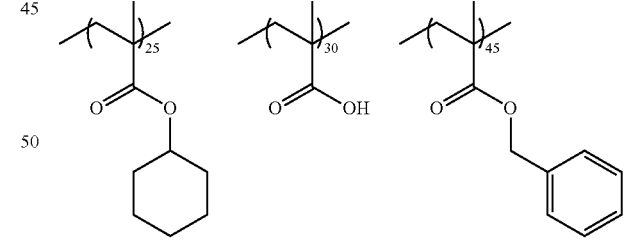
P-10
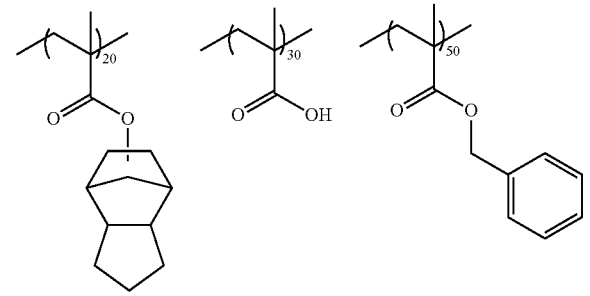

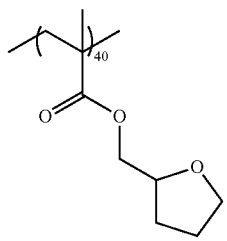 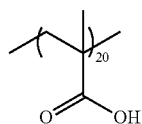 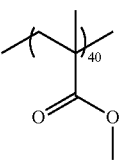

P-11

(Photoacid Generator)

G-1: Irgacure PAG103 (manufactured by BASF Corporation)

G-2: Compound of the following structural formula

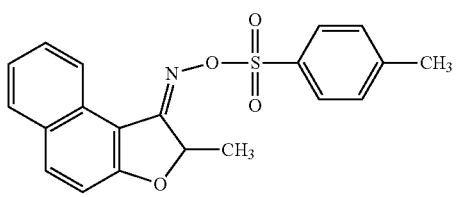 [SMILES: Cc1ccc(S(=O)(=O)O/N=C2/c3c(ccc4ccccc34)OC2C)cc1]

G-3: Compound of the following structural formula

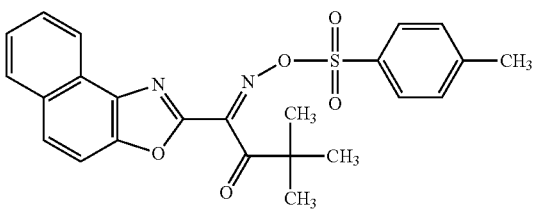 [SMILES: Cc1ccc(S(=O)(=O)O/N=C(\C(=O)C(C)(C)C)c2nc3c(ccc4ccccc43)o2)cc1]

<Synthesis of Compound G-2>

Compound G-2 was synthesized according to the method described in paragraph [0239] of JP2013-182077A.

<Synthesis of Compound G-3>

4.0 g of 1-amino-2-naphthol hydrochloride (manufactured by Tokyo Chemical Industry Co., Ltd.) was suspended in 16 g of N-methylpyrrolidone (manufactured by Wako Pure Chemical Industries, Ltd.) to which 3.4 g of sodium hydrogen carbonate (manufactured by Wako Pure Chemical Industries, Ltd.) was then added. 4.9 g of methyl 4,4-dimethyl-3-oxovalerate (manufactured by Wako Pure Chemical Industries, Ltd.) was added dropwise to the resulting solution. Under a nitrogen atmosphere, the resulting reaction mixture was heated at 120° C. for 2 hours. After allowing to cool, water and ethyl acetate were added to the reaction mixture to carry out liquid separation. The organic phase was recovered and magnesium sulfate was added thereto. Next, the resulting organic phase was filtered and the filtrate was recovered. Next, the filtrate was concentrated to give crude G-3-A. The crude G-3-A was purified by silica gel column chromatography to give 1.7 g of an intermediate G-3-A.

G-3-A (1.7 g) and p-xylene (6 mL) were mixed and 0.23 g of p-toluenesulfonic acid monohydrate (manufactured by Wako Pure Chemical Industries, Ltd.) was added thereto. The resulting reaction mixture was heated at 140° C. for 2 hours. After allowing to cool, water and ethyl acetate were added to the reaction mixture to carry out liquid separation. The organic phase was recovered and magnesium sulfate was added thereto. Next, the resulting organic phase was filtered and the filtrate was recovered. Next, the filtrate was concentrated to give crude G-3-B.

Tetrahydrofuran (THF) (2 mL) and the entire crude G-3-B were mixed. Under ice-cooling, 6.0 mL of a 2 M hydrochloric acid/THF solution and then isopentyl nitrite (manufactured by Wako Pure Chemical Industries, Ltd.) (0.84 g) were added dropwise thereto. The resulting reaction mixture was warmed to room temperature (25° C.) and then stirred for 2 hours. Water and ethyl acetate were added to the resulting reaction mixture to carry out liquid separation, and the organic phase was recovered. Next, the organic phase was washed with water and then magnesium sulfate was added thereto. Next, the resulting organic phase was filtered and the filtrate was recovered. Next, the filtrate was concentrated to give a crude G-3-C.

The entire crude G-3-C was mixed with acetone (10 mL). Under ice-cooling, triethylamine (manufactured by Wako Pure Chemical Industries, Ltd.) (1.2 g) and p-toluenesulfonyl chloride (manufactured by Tokyo Chemical Industry Co., Ltd.) (1.4 g) were added thereto and the temperature was raised to room temperature, followed by stirring for 1 hour. Water and ethyl acetate were added to the resulting reaction mixture to carry out liquid separation. The organic phase was recovered and magnesium sulfate was added thereto. Next, the resulting organic phase was filtered and the filtrate was recovered. Next, the filtrate was concentrated to give crude G-3. The crude G-3 was reslurried with cold methanol, filtered and dried to give G-3 (1.2 g).

$^1$H-NMR (Nuclear Magnetic Resonance) spectrum (300 MHz, CDCl$_3$) for G-3: δ=8.5-8.4 (m, 1H), 8.0-7.9 (m, 4H), 7.7-7.6 (m, 2H), 7.6-7.5 (m, 1H), 7.4 (d, 2H), 2.4 (s, 3H), 1.4 (s, 9H).

(Amine Compound (Corresponding to Quencher))

Q-1: solution of 2 mass % of N,N-dibutylaniline (manufactured by Tokyo Chemical Industry Co., Ltd.) in PGMEA Q-2: solution of 2 mass % of N-phenylmorpholine (manufactured by Tokyo Chemical Industry Co., Ltd.) in PGMEA

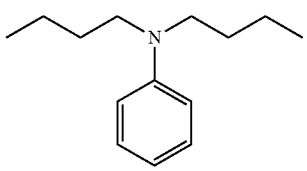

Q-1

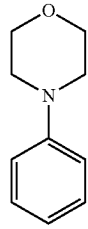

Q-2

(Silane Coupling Agent)

C-1: 3-methacryloxypropyltrimethoxysilane (KBM-503, manufactured by Shin-Etsu Chemical Co., Ltd.)

C-2: 3-glycidoxypropyltrimethoxysilane (KBM-403, manufactured by Shin-Etsu Chemical Co., Ltd.)

C-3: 2-(3,4-epoxycyclohexyl)ethyltrimethoxysilane (KBM-303, manufactured by Shin-Etsu Chemical Co., Ltd.)

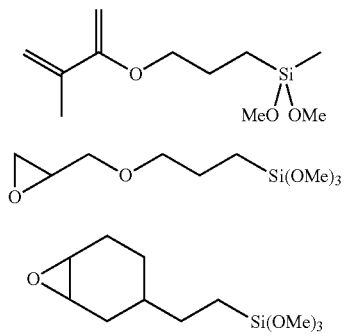

C-1

C-2

C-3

(Solvent)

PGMEA: propylene glycol monomethyl ether acetate (methoxypropyl acetate, manufactured by Showa Denko KK)

EEP: ethyl-3-ethoxypropionate

Anone: cyclohexanone

BA: butyl acetate (Surfactant)

S-1: solution prepared by diluting Megaface F-781-F (manufactured by DIC Corporation) with PGMEA to have a solid content of 2 mass %

S-2: Megaface RS-72-K (manufactured by DIC Corporation) (30 mass % PGMEA solution)

S-3: Megaface RS-55 (manufactured by DIC Corporation) (40 mass % PGMEA solution)

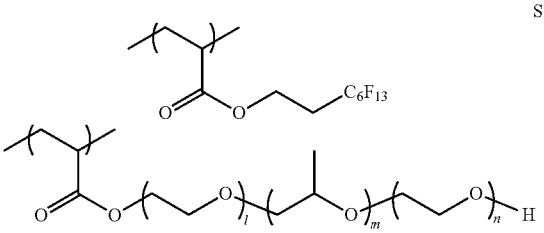

S-1

<Preparation of Titanium Black Dispersion Liquid B>

Preparation of titanium black T-1

100 g of titanium oxide MT-150A (trade name: manufactured by Tayca Corporation) having an average particle diameter of 15 nm, 25 g of silica particles AEROGIL (registered trademark) 300/30 (manufactured by Evonik Industries AG) having a BET specific surface area of 300 $m^2/g$, and 100 g of a dispersant Disperbyk 190 (trade name: manufactured by BYK Chemie GmbH) were weighed. 71 g of ion electric exchange water was added thereto. The mixture was treated in a MAZERSTAR KK-400W (manufactured by KURABO Industries Ltd.) at a revolution number of 1360 rpm and a rotation speed of 1047 rpm for 20 minutes to obtain a homogeneous mixture aqueous solution. This mixture aqueous solution was filled in a quartz container and heated to 920° C. in an oxygen atmosphere using a small rotary kiln (manufactured by Motoyama Corporation). Then, the atmosphere was replaced with nitrogen, and the mixture aqueous solution was subjected to a nitriding treatment by flowing ammonia gas at a rate of 100 mL/min for 5 hours at the same temperature. After completion of the treatment, the recovered powder was pulverized in a mortar to obtain titanium black (T-1) containing Si atoms and having a specific surface area of 73 $m^2/g$ in powder form [dispersoid containing titanium black particles and Si atoms].

The components shown in the following composition 1 were mixed for 15 minutes using a stirrer (EUROSTAR, manufactured by IKA) to obtain a dispersion b.

The second resin (X-1) described below was synthesized with reference to the description of JP2013-249417A. The second resin (X-1) had a weight-average molecular weight of 30,000 and an acid value of 60 mgKOH/g, and the number of atoms (excluding hydrogen atoms) in the graft chain thereof was 117.

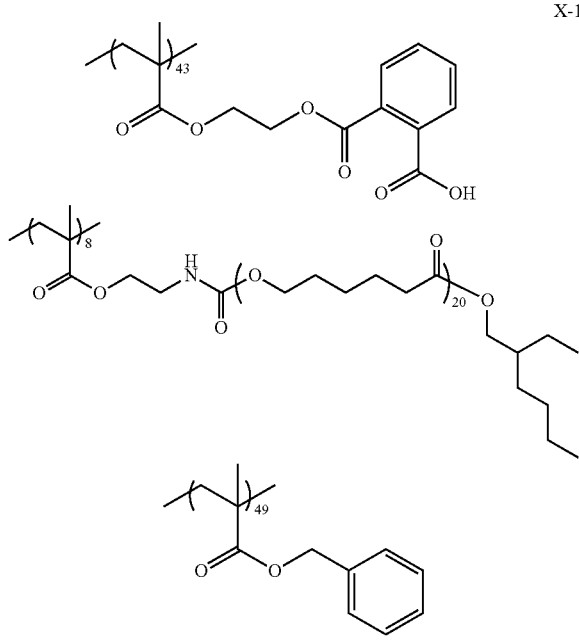

X-1

Composition 1

Titanium Black T-1: 25 parts by mass 30 mass % solution of the second resin (X-1) in propylene glycol monomethyl ether acetate: 25 parts by mass Propylene glycol monomethyl ether acetate (PGMEA) (solvent): 23 parts by mass Butyl acetate (BA) (solvent): 27 parts by mass The obtained dispersion b was subjected to a dispersion treatment using an NPM Pilot (manufactured by Shinmaru Enterprises Corporation) under the following conditions to obtain a titanium black dispersion liquid B.

(Dispersion Conditions)

Bead diameter. φ0.05 mm

Bead packing ratio: 65 vol %

Mill circumferential speed: 10 m/sec

Separator circumferential speed: 11 m/s

Amount of mixed solution subjected to dispersion treatment: 15.0 g

Circulation flow rate (pump supply amount): 60 kg/hour

Treatment liquid temperature: 20° C. to 25° C.

Cooling water: tap water at 5° C.

Beads mill annular passage inner volume: 2.2 L

Number of passes: 84 passes

<Preparation of Carbon Black Dispersion Liquid (CB Dispersion Liquid)>

K-042884-2 (manufactured by Toyo Ink Co., Ltd.) was used as a carbon black dispersion liquid. The carbon black dispersion liquid contains 19.3 mass % of black pigment (carbon black), 8.5 mass % of dispersant A (ACRYBASE FFS-6824, manufactured by Fujikura Kasei Co., Ltd.), 16.2 mass % of cyclohexanone, 38.4 mass % of propylene glycol monomethyl ether acetate, and 17.6 mass % of ethyl-3-ethoxypropionate.

<Red Pigment Dispersion Liquid: Dispersion Liquid R-1 Containing Pigment Red (PR) 254/Pigment Yellow (PY) 139>

A mixed solution made of 7.66 mass % of PR 254, 3.44 mass % of PY 139, 2.46 mass % (in terms of solid content) of the second resin (X-1), 4.94 mass % (in terms of solid content) of RD-F8 (manufactured by Nippon Shokubai Co., Ltd.), and 81.50 mass % of propylene glycol methyl ether acetate (PGMEA) was mixed and dispersed in a beads mill (zirconia beads, 0.3 mm in diameter) for 3 hours to prepare a pigment dispersion liquid. This was followed by a further dispersion treatment at a flow rate of 500 g/min under a pressure of 2,000 kg/cm$^3$ using a high-pressure disperser NANO-3000-10 (manufactured by Nippon BEE Chemical Co., Ltd.) equipped with a pressure reducing mechanism. This dispersion treatment was repeated ten times to obtain a red pigment dispersion liquid R-1.

<Synthesis of Xanthene Dye Polymer>

A colorant multimer (xanthene Xa) was obtained according to the method for producing a salt-forming compound (A-1) described in paragraph [0165] of JP2011-242752A. The structures of the monomers and colorants used are shown below. The weight-average molecular weight (Mw) of the colorant multimer (xanthene Xa) confirmed by GPC measurement was 10,500.

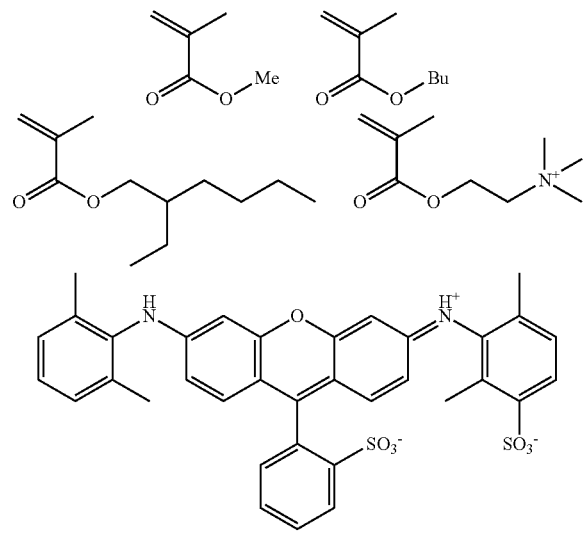

<Preparation of Coloring Photosensitive Composition>

The components were stirred and mixed so as to have the respective component amounts as shown in Table 1 to be described later to prepare coloring photosensitive compositions (Examples 1 to 28 and Comparative Examples 1 to 3).

<Evaluation of Absorbance (OD)>

Each of the coloring photosensitive compositions of Examples and Comparative Examples was spin-coated on a glass substrate (Corning 1737 [trade name], manufactured by Corning Incorporated) which was then heat-treated (pre-baked) on a hot plate at 100° C. for 2 minutes. Thereafter, the substrate was heat-treated (post-baked) on a hot plate at 220° C. for 300 seconds to obtain a coating film-attached substrate.

The spin coating rotation speed was adjusted so that the film thickness after post-baking became 2 μm.

The absorbance was measured at a wavelength of 500 nm using UV-3600 (trade name, manufactured by Shimadzu Corporation). The measurement was carried out at room temperature (25° C.).

<Evaluation of Reflectivity>

Each of the coloring photosensitive compositions of Examples and Comparative Examples was spin-coated on a glass substrate (Corning 1737 [trade name], manufactured by Corning Incorporated) which was then heat-treated (pre-baked) on a hot plate at 100° C. for 2 minutes.

Thereafter, using the developer of 2.38 wt % tetramethylammonium hydroxide (TMAH), the resulting substrate was subjected to puddle development for 10 to 60 seconds (time required for resolving in the case where patternwise exposure was carried out), followed by washing with water and drying. Then, the substrate was heat-treated (post-baked) on a hot plate at 220° C. for 300 seconds to prepare a resin film-attached substrate.

Light having a wavelength of 400 to 700 nm was incident on the resin film of the resin film-attached substrate thus prepared at an incidence angle of 5°, and the reflectivity of the resin film was measured with a spectrometer UV4100 (trade name, manufactured by Hitachi High-Technologies Corporation).

<Evaluation of Surface Roughness (Arithmetic Average Roughness Ra)>

Each of the coloring photosensitive compositions of Examples and Comparative Examples was spin-coated on a glass substrate (Corning 1737 [trade name], manufactured by Corning Incorporated) which was then heat-treated (pre-baked) on a hot plate at 100° C. for 2 minutes.

Thereafter, using the developer of 2.38 wt % TMAH, the substrate was subjected to puddle development for 10 to 60 seconds, followed by washing with water and drying. Then, the substrate was heat-treated (post-baked) on a hot plate at 220° C. for 300 seconds to prepare a resin film-attached substrate.

Using a Dektak XT (manufactured by BRUKER), the surface roughness at a distance of 1 mm of the resin film on the resulting substrate was measured (resolution: 1 μm/point), and the arithmetic average roughness Ra was determined.

<Evaluation of Light Scattering>

Each of the coloring photosensitive compositions of Examples and Comparative Examples was spin-coated on a glass substrate (Corning 1737 [trade name], manufactured by Corning Incorporated) which was then heat-treated (pre-baked) on a hot plate at 100° C. for 2 minutes.

Thereafter, using the developer of 2.38 wt % TMAH, the substrate was subjected to puddle development for 10 to 60 seconds, followed by washing with water and drying. Then, the substrate was heat-treated (post-baked) on a hot plate at 220° C. for 300 seconds to prepare a resin film-attached substrate. The thickness of the resin film was 0.5 μm.

With respect to this substrate, light scattering measurement was carried out using a light scattering apparatus ("DYNA 3000" manufactured by Otsuka Electronics Co., Ltd.). From the obtained peaks, the structural period (period length (μm)) was determined according to the foregoing Expression (I).

In Table 1, the column "Requirement 1 and/or Requirement 2" indicates which one of the above-mentioned requirements 1 and 2 is satisfied. For example, "Requirement 1 and Requirement 2" is intended to satisfy both Requirement 1 and Requirement 2.

Further, in the column "Composition of coloring photosensitive composition" in Table 1, the column "Pigment dispersion liquid" (columns "Pigment" and "Second resin"), the column "First resin", the column "Third resin", the column "Photoacid generator", the column "Amine compound", the column "Silane coupling agent", and the column "Surfactant" represent parts by mass (solid content) of each compound. The column "Solvent" represents parts by mass of each solvent.

The column "Presence/absence of peak" in Table 1 represents whether or not a peak satisfying the above-mentioned provisions in the above-mentioned light scattering measurement (a peak having a value of A1/A2 of greater than 0.1 and 2.5 or less) is observed.

TABLE 1

| | | | Example 1 | | Example 2 | | Example 3 | |
|---|---|---|---|---|---|---|---|---|
| | | | Type | Amount | Type | Amount | Type | Amount |
| Composition of coloring photosensitive composition | Pigment dispersion liquid (solid content) | Pigment | Titanium black (dispersion liquid B) | 11 | Titanium black (dispersion liquid B) | 11 | Titanium black (dispersion liquid B) | 11 |
| | | Second resin | X-1 | 3 | X-1 | 3 | X-1 | 3 |
| | First resin | | P-1 | 3 | P-1 | 3 | P-1 | 3 |
| | Third resin | | P-6 | 7 | P-6 | 7 | P-6 | 7 |
| | Photoacid generator | | G-3 | 1 | G-1 | 1 | G-2 | 1 |
| | Amine compound | | Q-1 | 0.05 | Q-1 | 0.05 | Q-1 | 0.05 |
| | Silane coupling agent | | C-1 | 0.5 | C-1 | 0.5 | C-1 | 0.5 |
| | Surfactant | | S-1 | 0.04 | S-1 | 0.04 | S-1 | 0.04 |
| | Solvent | | PGMEA | 45 | PGMEA | 45 | PGMEA | 45 |
| | | | BA | 11 | BA | 11 | BA | 11 |
| | | | Anone | 18 | Anone | 18 | Anone | 18 |
| Requirement 1 and/or Requirement 2 | | | Requirement 1 and Requirement 2 | | Requirement 1 and Requirement 2 | | Requirement 1 and Requirement 2 | |
| Resin film | Presence/absence of peak | | Present | | Present | | Present | |
| | A1/A2 | | 0.8 | | 0.8 | | 0.7 | |
| | Surface roughness Ra (Å) | | 800 | | 700 | | 900 | |
| Evaluation | Reflectivity after development (%) | | 0.9 | | 1.4 | | 1 | |
| | OD | | 2.5 | | 2.5 | | 2.5 | |
| | Period length (μm) | | 1.4 | | 1.3 | | 1.5 | |

| | | | Example 4 | | Example 5 | | Example 6 | |
|---|---|---|---|---|---|---|---|---|
| | | | Type | Amount | Type | Amount | Type | Amount |
| Composition of coloring photosensitive composition | Pigment dispersion liquid (solid content) | Pigment | Titanium black (dispersion liquid B) | 11 | Titanium black (dispersion liquid B) | 11 | Titanium black (dispersion liquid B) | 11 |
| | | Second resin | X-1 | 3 | X-1 | 3 | X-1 | 3 |
| | First resin | | P-1 | 3 | P-1 | 3 | P-1 | 3 |
| | Third resin | | P-6 | 7 | P-6 | 7 | P-6 | 7 |
| | Photoacid generator | | G-3 | 1 | G-3 | 1 | G-3 | 1 |
| | Amine compound | | Q-2 | 0.05 | Q-1 | 0.05 | Q-1 | 0.05 |
| | Silane coupling agent | | C-1 | 0.5 | C-2 | 0.5 | C-3 | 0.5 |
| | Surfactant | | S-1 | 0.04 | S-1 | 0.04 | S-1 | 0.04 |
| | Solvent | | PGMEA | 45 | PGMEA | 45 | PGMEA | 45 |
| | | | BA | 11 | BA | 11 | BA | 11 |
| | | | Anone | 18 | Anone | 18 | Anone | 18 |
| Requirement 1 and/or Requirement 2 | | | Requirement 1 and Requirement 2 | | Requirement 1 and Requirement 2 | | Requirement 1 and Requirement 2 | |
| Resin film | Presence/absence of peak | | Present | | Present | | Present | |
| | A1/A2 | | 0.7 | | 0.8 | | 0.7 | |
| | Surface roughness Ra (Å) | | 800 | | 800 | | 800 | |
| Evaluation | Reflectivity after development (%) | | 1.2 | | 0.8 | | 1.3 | |
| | OD | | 2.4 | | 2.4 | | 2.4 | |
| | Period length (μm) | | 1.2 | | 1.4 | | 1.5 | |

| | | | Example 7 | | Example 8 | | Example 9 | | Example 10 | |
|---|---|---|---|---|---|---|---|---|---|---|
| | | | Type | Amount | Type | Amount | Type | Amount | Type | Amount |
| Composition of coloring photosensitive composition | Pigment dispersion liquid (solid content) | Pigment | Titanium black (dispersion liquid B) | 11 | Titanium black (dispersion liquid B) | 11 | Titanium black (dispersion liquid B) | 11 | Titanium black (dispersion liquid B) | 11 |
| | | Second resin | X-1 | 3 | X-1 | 3 | X-1 | 3 | X-1 | 3 |
| | First resin | | P-1 | 3 | P-1 | 3 | P-2 | 3 | P-3 | 3 |
| | Third resin | | P-6 | 7 | P-6 | 7 | P-6 | 7 | P-6 | 7 |
| | Photoacid generator | | G-3 | 1 | G-3 | 1 | G-3 | 1 | G-3 | 1 |

TABLE 1-continued

|  |  | Type | Amount | Type | Amount | Type | Amount | Type | Amount |
|---|---|---|---|---|---|---|---|---|---|
|  | Amine compound | Q-1 | 0.05 | Q-1 | 0.05 | Q-1 | 0.05 | Q-1 | 0.05 |
|  | Silane coupling agent | C-1 | 0.5 | C-1 | 0.5 | C-1 | 0.5 | C-1 | 0.5 |
|  | Surfactant | S-1 | 0.03 | S-1 | 0.03 | S-1 | 0.04 | S-1 | 0.04 |
|  |  | S-2 | 0.75 | S-3 | 0.8 |  |  |  |  |
|  | Solvent | PGMEA | 45 | PGMEA | 45 | PGMEA | 45 | PGMEA | 45 |
|  |  | BA | 11 | BA | 11 | BA | 11 | BA | 11 |
|  |  | Anone | 18 | Anone | 18.5 | Anone | 18 | Anone | 18 |
| Requirement 1 and/or Requirement 2 |  | Requirement 1 and Requirement 2 |  | Requirement 1 and Requirement 2 |  | Requirement 1 and Requirement 2 |  | Requirement 1 and Requirement 2 |  |
| Resin film | Presence/absence of peak | Present |  | Present |  | Present |  | Present |  |
|  | A1/A2 | 0.9 |  | 0.8 |  | 0.6 |  | 0.7 |  |
|  | Surface roughness Ra (Å) | 600 |  | 600 |  | 900 |  | 800 |  |
| Evaluation | Reflectivity after development (%) | 0.7 |  | 0.8 |  | 1 |  | 1.3 |  |
|  | OD | 2.3 |  | 2.4 |  | 2.5 |  | 2.5 |  |
|  | Period length (μm) | 1.4 |  | 1.0 |  | 1.4 |  | 1.3 |  |

|  |  |  | Example 11 | | Example 12 | | Example 13 | |
|---|---|---|---|---|---|---|---|---|
|  |  |  | Type | Amount | Type | Amount | Type | Amount |
| Composition of coloring photosensitive composition | Pigment dispersion liquid (solid content) | Pigment | Titanium black (dispersion liquid B) | 11 | Titanium black (dispersion liquid B) | 11 | Titanium black (dispersion liquid B) | 11 |
|  |  | Second resin | X-1 | 3 | X-1 | 3 | X-1 | 3 |
|  | First resin |  | P-4 | 3 | P-1 | 1.5 | P-11 | 3 |
|  |  |  |  |  | P-5 | 1.5 |  |  |
|  | Third resin |  | P-6 | 7 | P-6 | 7 | P-6 | 7 |
|  | Photoacid generator |  | G-3 | 1 | G-3 | 1 | G-3 | 1 |
|  | Amine compound |  | Q-1 | 0.05 | Q-1 | 0.05 | Q-1 | 0.05 |
|  | Silane coupling agent |  | C-1 | 0.5 | C-1 | 0.5 | C-3 | 0.5 |
|  | Surfactant |  | S-1 | 0.04 | S-1 | 0.04 | S-1 | 0.04 |
|  | Solvent |  | PGMEA | 45 | PGMEA | 45 | PGMEA | 45 |
|  |  |  | BA | 11 | BA | 11 | BA | 11 |
|  |  |  | Anone | 18 | Anone | 18 | Anone | 18 |
| Requirement 1 and/or Requirement 2 |  |  | Requirement 2 |  | Requirement 1 and Requirement 2 |  | Requirement 2 |  |
| Resin film | Presence/absence of peak |  | Present |  | Present |  | Present |  |
|  | A1/A2 |  | 0.7 |  | 0.7 |  | 0.8 |  |
|  | Surface roughness Ra (Å) |  | 800 |  | 900 |  | 1000 |  |
| Evaluation | Reflectivity after development (%) |  | 1.6 |  | 0.9 |  | 0.7 |  |
|  | OD |  | 2.5 |  | 2.5 |  | 2.4 |  |
|  | Period length (μm) |  | 1.5 |  | 1.2 |  | 1.2 |  |

|  |  |  | Example 14 | | Example 15 | | Example 16 | | Example 17 | |
|---|---|---|---|---|---|---|---|---|---|---|
|  |  |  | Type | Amount | Type | Amount | Type | Amount | Type | Amount |
| Composition of coloring photosensitive composition | Pigment dispersion liquid (solid content) | Pigment | Titanium black (dispersion liquid B) | 14 | Carbon black (CB dispersion liquid) | 10 | Carbon black (CB dispersion liquid) | 10 | Carbon black (CB dispersion liquid) | 10 |
|  |  | Second resin | X-1 | 4 |  |  |  |  |  |  |
|  |  | Dispersant |  |  | ACRYBASE FFS-6824 | 4 | ACRYBASE FFS-6824 | 4 | ACRYBASE FFS-6824 | 4 |
|  | First resin |  | P-1 | 1 | P-1 | 7 | P-1 | 7 | P-1 | 6 |
|  | Second resin |  |  |  | P-7 | 3 | P-7 | 3 | P-7 | 1 |
|  |  |  |  |  |  |  |  |  | P-8 | 2 |
|  | Third resin |  | P-6 | 5 |  |  |  |  |  |  |
|  | Photoacid generator |  | G-3 | 1 | G-3 | 1 | G-3 | 1 | G-3 | 1 |
|  | Amine compound |  | Q-1 | 0.05 | Q-1 | 0.04 | Q-1 | 0.04 | Q-1 | 0.04 |
|  | Silane coupling agent |  | C-1 | 1 | C-1 | 0.5 | C-2 | 0.5 | C-2 | 0.5 |
|  | Surfactant |  | S-1 | 0.03 | S-1 | 0.03 | S-1 | 0.03 | S-1 | 0.03 |
|  | Solvent |  | PGMEA | 41 | PGMEA | 45 | PGMEA | 45 | PGMEA | 46 |
|  |  |  | BA | 15 | EEP | 9 | EEP | 9 | EEP | 9 |
|  |  |  | Anone | 18 | Anone | 20 | Anone | 20 | Anone | 20 |
| Requirement 1 and/or Requirement 2 |  |  | Requirement 1 and Requirement 2 |  | Requirement 1 |  | Requirement 1 |  | Requirement 1 |  |
| Resin film | Presence/absence of peak |  | Present |  | Present |  | Present |  | Present |  |
|  | A1/A2 |  | 0.6 |  | 0.5 |  | 0.6 |  | 0.6 |  |
|  | Surface roughness Ra (Å) |  | 1000 |  | 1600 |  | 1300 |  | 900 |  |

TABLE 1-continued

| Evaluation | Reflectivity after development (%) | 0.8 | 0.1 | 0.2 | 0.9 |
|---|---|---|---|---|---|
| | OD | 3.2 | 2.4 | 2.6 | 2.7 |
| | Period length (μm) | 1.3 | 1.4 | 1.5 | 1.3 |

| | | | Example 18 | | Example 19 | | Example 20 | |
|---|---|---|---|---|---|---|---|---|
| | | | Type | Amount | Type | Amount | Type | Amount |
| Composition of coloring photosensitive composition | Pigment dispersion liquid (solid content) | Pigment | Carbon black (CB dispersion liquid) | 10 | Carbon black (CB dispersion liquid) | 10 | Carbon black (CB dispersion liquid) | 10 |
| | | Second resin | | | | | | |
| | | Dispersant | ACRYBASE FFS-6824 | 4 | ACRYBASE FFS-6824 | 4 | ACRYBASE FFS-6824 | 4 |
| | First resin | | P-1 | 6 | P-1 | 6 | P-1 | 6 |
| | Second resin | | P-9 | 3 | P-10 | 3 | P-9 | 1 |
| | | | | | | | P-7 | 2 |
| | Third resin | | | | | | | |
| | Photoacid generator | | G-3 | 1 | G-3 | 1 | G-3 | 1 |
| | Amine compound | | Q-1 | 0.04 | Q-1 | 0.04 | Q-1 | 0.04 |
| | Silane coupling agent | | C-1 | 0.5 | C-1 | 0.5 | | |
| | Surfactant | | S-1 | 0.03 | S-1 | 0.03 | S-1 | 0.03 |
| | Solvent | | PGMEA | 46 | PGMEA | 46 | PGMEA | 46 |
| | | | EEP | 9 | EEP | 9 | EEP | 9 |
| | | | Anone | 20 | Anone | 20 | Anone | 20 |
| Requirement 1 and/or Requirement 2 | | | Requirement 1 | | Requirement 1 | | Requirement 1 | |
| Resin film | Presence/absence of peak | | Present | | Present | | Present | |
| | A1/A2 | | 0.8 | | 0.9 | | 0.8 | |
| | Surface roughness Ra (Å) | | 550 | | 500 | | 700 | |
| Evaluation | Reflectivity after development (%) | | 2 | | 2.5 | | 1.8 | |
| | OD | | 2.7 | | 2.6 | | 2.7 | |
| | Period length (μm) | | 1.0 | | 1.8 | | 1.2 | |

| | | | Example 21 | | Example 22 | | Example 23 | | Example 24 | |
|---|---|---|---|---|---|---|---|---|---|---|
| | | | Type | Amount | Type | Amount | Type | Amount | Type | Amount |
| Composition of coloring photosensitive composition | Pigment dispersion liquid (solid content) | Pigment | Titanium black (dispersion liquid B)/Carbon black (CB dispersion liquid) | 8/3 | PR 254/PY 139 (dispersion liquid R-1) | 3.1/1.4 | Xanthene Xa (dye) | 11 | Titanium black (dispersion liquid B) | 14 |
| | | Second resin | X-1 | 3 | X-1 | 1 | | | X-1 | 4 |
| | | Dispersant | ACRYBASE FFS-6824 | 1 | RD-F8 | 2 | | | | |
| | First resin | | P-1 | 3 | P-2 | 5 | P-2 | 3 | P-1 | 0.2 |
| | Second resin | | | | | | P-7 | 3 | | |
| | Third resin | | P-6 | 6 | P-6 | 10 | P-6 | 7 | P-6 | 5.8 |
| | Photoacid generator | | G-3 | 1 | G-3 | 1 | G-3 | 1 | G-3 | 1 |
| | Amine compound | | Q-1 | 0.05 | Q-1 | 0.04 | Q-1 | 0.05 | Q-1 | 0.05 |
| | Silane coupling agent | | C-3 | 0.5 | C-1 | 0.5 | C-1 | 0.5 | C-1 | 1 |
| | Surfactant | | S-1 | 0.04 | S-1 | 0.03 | S-1 | 0.04 | S-1 | 0.03 |
| | Solvent | | PGMEA | 40 | PGMEA | 72 | PGMEA | 34 | PGMEA | 41 |
| | | | XBA | 9 | Anone | 4 | Anone | 40 | BA | 15 |
| | | | EEP | 3 | | | | | Anone | 18 |
| | | | Anone | 23 | | | | | | |
| Requirement 1 and/or Requirement 2 | | | Requirement 1 and Requirement 2 | | Requirement 1 and Requirement 2 | | Requirement 1 and Requirement 2 | | Requirement 1 and Requirement 2 | |
| Resin film | Presence/absence of peak | | Present | | Present | | Present | | Present | |
| | A1/A2 | | 0.8 | | 1 | | 1.5 | | 2.1 | |
| | Surface roughness Ra (Å) | | 700 | | 250 | | 200 | | 80 | |
| Evaluation | Reflectivity after development (%) | | 1.5 | | 3.2 | | 4 | | 5.6 | |
| | OD | | 2.7 | | 1.4 | | <1 | | 3 | |
| | Period length (μm) | | 1.2 | | 1.7 | | 1.9 | | — | |

TABLE 1-continued

|  |  |  | Example 25 | | Example 26 | | Example 27 | | Example 28 | |
| --- | --- | --- | --- | --- | --- | --- | --- | --- | --- | --- |
|  |  |  | Type | Amount | Type | Amount | Type | Amount | Type | Amount |
| Composition of coloring photosensitive composition | Pigment dispersion liquid (solid content) | Pigment | Titanium black (dispersion liquid B) | 14 | Carbon black (CB dispersion liquid) | 10 | Titanium black (dispersion liquid B) | 11 | Titanium black (dispersion liquid B) | 11 |
|  |  | Second resin Dispersant | X-1 | 4 | ACRYBASE FFS-6824 | 4 | X-1 | 3 | X-1 | 3 |
|  |  | First resin | P-1 | 0.2 | P-1 | 7 | P-1 | 3 | P-1 | 3 |
|  |  | Second resin | P-9 | 2 | P-7 | 1 |  |  |  |  |
|  |  | Third resin | P-6 | 3.8 | P-6 | 2 | P-6 | 7 | P-6 | 7 |
|  |  | Photoacid generator | G-2 | 1 | G-3 | 1 | G-3 | 1 | G-3 | 1 |
|  |  | Amine compound | Q-2 | 0.05 | Q-1 | 0.04 | Q-1 | 0.05 | Q-1 | 0.05 |
|  |  | Silane coupling agent | C-3 | 1 | C-2 | 0.5 |  |  | C-1 | 0.5 |
|  |  | Surfactant | S-1 | 0.03 | S-1 | 0.03 | S-1 | 0.04 |  |  |
|  |  | Solvent | PGMEA | 41 | PGMEA | 45 | PGMEA | 45 | PGMEA | 45 |
|  |  |  | BA | 15 | EEP | 9 | BA | 11 | BA | 11 |
|  |  |  | Anone | 18 | Anone | 20 | Anone | 18 | Anone | 18 |
| Requirement 1 and/or Requirement 2 |  |  | Requirement 1 and Requirement 2 | | Requirement 1 and Requirement 2 | | Requirement 1 and Requirement 2 | | Requirement 1 and Requirement 2 | |
| Resin film | Presence/absence of peak |  | Present | | Present | | Present | | Present | |
|  | A1/A2 |  | 2.2 | | 0.6 | | 0.8 | | 0.8 | |
|  | Surface roughness Ra (Å) |  | 70 | | 100 | | 800 | | 800 | |
| Evaluation | Reflectivity after development (%) |  | 5.9 | | 5.2 | | 0.9 | | 0.9 | |
|  | OD |  | 3 | | 2.5 | | 2.5 | | 24 | |
|  | Period length (μm) |  | — | | 2.2 | | 1.3 | | 1.4 | |

|  |  |  | Comparative Example 1 | | Comparative Example 2 | | Comparative Example 3 | |
| --- | --- | --- | --- | --- | --- | --- | --- | --- |
|  |  |  | Type | Amount | Type | Amount | Type | Amount |
| Composition of coloring photosensitive composition | Pigment dispersion liquid (solid content) | Pigment | Titanium black (dispersion liquid B) | 11 | Titanium black (dispersion liquid B) | 14 | Titanium black (dispersion liquid B) | 14 |
|  |  | Second resin | X-1 | 3 | X-1 | 4 | X-1 | 4 |
|  |  | First resin | — | | — | | — | |
|  |  | Third resin | P-6 | 11 | P-6 | 7 | P-6 | 6 |
|  |  | Photoacid generator | G-3 | 1 | G-3 | 1 | G-3 | 1 |
|  |  | Amine compound | Q-1 | 0.04 | Q-1 | 0.05 | Q-1 | 0.05 |
|  |  | Silane coupling agent | C-1 | 0.5 | C-1 | 1 | C-1 | 1 |
|  |  | Surfactant | S-1 | 0.03 | S-1 | 0.03 | S-1 | 0.03 |
|  |  | Solvent | PGMEA | 44 | PGMEA | 40 | PGMEA | 41 |
|  |  |  | BA | 11 | BA | 15 | BA | 15 |
|  |  |  | Anone | 18 | Anone | 18 | Anone | 18 |
| Requirement 1 and/or Requirement 2 |  |  | Requirement 2 | | Requirement 2 | | Requirement 2 | |
| Resin film | Presence/absence of peak |  | Absent | | Absent | | Absent | |
|  | A1/A2 |  | — | | — | | — | |
|  | Surface roughness Ra (Å) |  | 20 | | 30 | | 40 | |
| Evaluation | Reflectivity after development (%) |  | 7.8 | | 7 | | 6.6 | |
|  | OD |  | 2.4 | | 3.1 | | 3 | |
|  | Period length (μm) |  | — | | — | | — | |

As shown in Table 1 above, it was confirmed that the resin film of the present invention produced using the coloring photosensitive composition exhibits the desired effects.

In particular, as can be seen from the comparison of Examples 1 and 9 to 11, it was confirmed that the effects were excellent in the case where the cyclic ether group had a 4- to 6-membered ring structure (preferably a 5-membered structure).

In addition, as can be seen from the comparison of Examples 1, 7 and 8, it was confirmed that the effects were excellent in the case where S-2 and S-3 were used.

Further, from the comparison of Examples 15 with Examples 18 and 19, it was confirmed that the effects were excellent in the case where the second resin contained a linear alkylene group.

Further, from the comparison of Example 14 with Examples 24 and 25 and the comparison of Example 15 with Example 26, it was confirmed that the effects were excellent in the case where the mass ratio of the mass of the first resin to the mass of the second resin (mass of first resin/mass of second resin) was in the range of 0.2 to 5.

On the other hand, the desired effects were not obtained in Comparative Examples 1 to 3 which did not satisfy the predetermined requirements.

Each of the coloring photosensitive compositions of Examples and Comparative Examples was spin-coated on a glass substrate (Corning 1737 [trade name], manufactured by Corning Incorporated) which was then heat-treated (pre-baked) on a hot plate at 100° C. for 2 minutes.

Thereafter, the coating film obtained above was subjected to an exposure treatment (exposure apparatus: UX3100-SR, manufactured by Ushio Inc., exposure dose: 1000 mJ/cm$^2$) through a predetermined mask. Then, using the developer of 2.38 wt % tetramethylammonium hydroxide (TMAH), the resulting substrate was subjected to puddle development for 10 to 60 seconds, followed by washing with water and drying. Then, the substrate was heat-treated (post-baked) on a hot plate at 220° C. for 300 seconds to prepare a patterned resin film-attached substrate.

What is claimed is:

1. A resin film, comprising:
    at least two or more resins;
    a coloring agent; and
    a photoacid generator,
    wherein the resin film has a peak at which the value of A1/A2 is greater than 0.1 and 2.5 or less in a light scattering measurement of the resin film, in the case where a half-width of the peak is A1 and a scattering angle of a maximum light intensity of the peak is A2 in a spectrum in which a scattering angle is plotted on the horizontal axis and a scattered light intensity is plotted on the vertical axis.

2. The resin film according to claim 1, wherein a surface roughness Ra is 100 to 2000 Å.

3. The resin film according to claim 2, wherein the resin film has a phase separation structure in which the structural period shows 0.1 to 2 μm.

4. The resin film according to claim 1, wherein the resin film has a phase separation structure in which the structural period shows 0.1 to 2 μm.

5. A color filter, comprising:
    the resin film according to claim 1.

6. A light shielding film, comprising:
    the resin film according to claim 1.

7. A solid-state imaging element, comprising:
    the resin film according to claim 1.

8. An image display device, comprising:
    the resin film according to claim 1.

* * * * *